US009564917B1

United States Patent
Satpathy et al.

(10) Patent No.: US 9,564,917 B1
(45) Date of Patent: Feb. 7, 2017

(54) INSTRUCTION AND LOGIC FOR ACCELERATED COMPRESSED DATA DECODING

(71) Applicant: Intel Corporation, Santa Clara, CA (US)

(72) Inventors: Sudhir K. Satpathy, Hillsboro, OR (US); Sanu K. Mathew, Hillsboro, OR (US); Vikram B. Suresh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/974,917

(22) Filed: Dec. 18, 2015

(51) Int. Cl.
*H03M 7/00* (2006.01)
*H03M 7/40* (2006.01)

(52) U.S. Cl.
CPC ..................................... *H03M 7/40* (2013.01)

(58) Field of Classification Search
CPC ............ H03M 7/30; H03M 7/40; H03M 7/46; H03M 7/3082; H03M 7/3095; H03M 7/3088; H03M 7/6029; H03M 7/6023; H03M 7/3059
USPC ....................................................... 341/50–90
See application file for complete search history.

(56) References Cited

U.S. PATENT DOCUMENTS

| | | | | | |
|---|---|---|---|---|---|
| 5,150,430 | A | * | 9/1992 | Chu | H03M 7/3086 341/51 |
| 5,485,211 | A | * | 1/1996 | Kuzma | H04N 21/236 375/240.16 |
| 5,884,269 | A | * | 3/1999 | Cellier | H03M 7/40 341/64 |
| 6,023,233 | A | * | 2/2000 | Craven | H03M 7/30 341/51 |
| 6,188,797 | B1 | * | 2/2001 | Moledina | G06T 9/005 341/67 |
| 6,205,223 | B1 | * | 3/2001 | Rao | G10L 19/00 341/51 |
| 7,296,212 | B1 | * | 11/2007 | Hammons, Jr. | H03M 13/356 714/701 |
| 7,394,698 | B1 | * | 7/2008 | Chu | G11C 16/225 365/185.2 |
| 7,990,289 | B2 | * | 8/2011 | Monro | H03M 7/30 341/50 |
| 8,144,037 | B2 | * | 3/2012 | Monro | H03M 7/30 341/107 |

OTHER PUBLICATIONS

Deutsch, P.; Deflate Compressed Data Format Specification version 1.3; Network Working Group; Aladdin Enterprises; 15 pages, May 1996.

* cited by examiner

*Primary Examiner* — Lam T Mai
(74) *Attorney, Agent, or Firm* — Baker Botts L.L.P.

(57) ABSTRACT

A processor includes an execution unit to decode compressed data. The execution unit includes a code information array, a matching logic unit, a code value generator, and a decoder. The code information array includes a pre-computed code length counter and a pre-computed last code. The matching logic unit includes logic using the code information array to match a segment of a payload of the compressed data with a matching code length and a matching code index. The code value generator includes logic to translate the matching code index into a code value. The decoder includes logic to generate decompressed data from the code value and the matching code length.

20 Claims, 24 Drawing Sheets

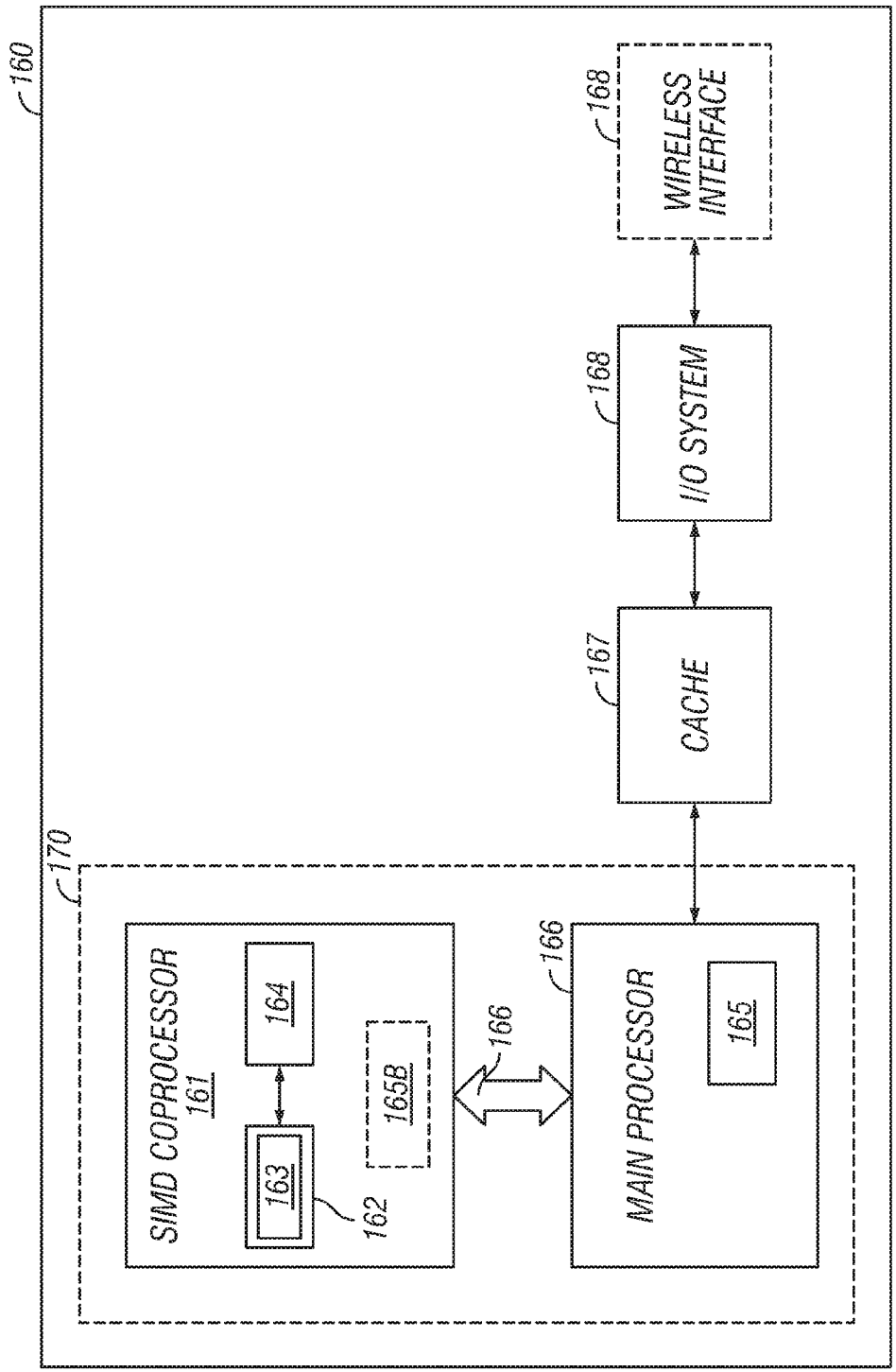

*Length Code Translation Table - 1702*

| Code-1 | Length | Base | Extra bits |
|---|---|---|---|
| 256 | 0 | 000 | 0 |
| 257 | 1 | 001 | 0 |
| 258 | 2 | 010 | 0 |
| 259 | 3 | 011 | 0 |
| 260 | 4 | 100 | 0 |
| 261 | 5 | 101 | 0 |
| 262 | 6 | 110 | 0 |
| 263 | 7 | 111 | 0 |
| 264 | 8-9 | 100 | 1 |
| 265 | 10-11 | 101 | 1 |
| 266 | 12-13 | 110 | 1 |
| 267 | 14-15 | 111 | 1 |
| 268 | 16-19 | 100 | 2 |
| 269 | 20-23 | 101 | 2 |
| 270 | 24-27 | 110 | 2 |
| 271 | 28-31 | 111 | 2 |
| 272 | 32-39 | 100 | 3 |
| 273 | 40-47 | 101 | 3 |
| 274 | 48-55 | 110 | 3 |
| 275 | 56-63 | 111 | 3 |
| 276 | 64-79 | 100 | 4 |
| 277 | 80-95 | 101 | 4 |
| 278 | 96-111 | 110 | 4 |
| 279 | 112-127 | 111 | 4 |
| 280 | 128-159 | 100 | 5 |
| 281 | 160-191 | 101 | 5 |
| 282 | 192-223 | 110 | 5 |
| 283 | 224-254 | 111 | 5 |
| 284 | 255 | LEN_255 | |

*FIG. 17*

*Distance Code Translation Table - 1902*

| Code | Distance | Base | Extra bits |
|---|---|---|---|
| 0 | 0 | 00 | 0 |
| 1 | 1 | 01 | 0 |
| 2 | 2 | 10 | 0 |
| 3 | 3 | 11 | 0 |
| 4 | 4-5 | 10 | 1 |
| 5 | 6-7 | 11 | 1 |
| 6 | 8-11 | 10 | 2 |
| 7 | 12-15 | 11 | 2 |
| 8 | 16-23 | 10 | 3 |
| 9 | 24-31 | 11 | 3 |
| 10 | 32-47 | 10 | 4 |
| 11 | 48-63 | 11 | 4 |
| 12 | 64-95 | 10 | 5 |
| 13 | 96-127 | 11 | 5 |
| 14 | 128-191 | 10 | 6 |
| 15 | 192-255 | 11 | 6 |
| 16 | 256-383 | 10 | 7 |
| 17 | 384-511 | 11 | 7 |
| 18 | 512-767 | 10 | 8 |
| 19 | 768-1023 | 11 | 8 |
| 20 | 1024-1535 | 10 | 9 |
| 21 | 1536-2047 | 11 | 9 |
| 22 | 2048-3071 | 10 | 10 |
| 23 | 3072-4095 | 11 | 10 |
| 24 | 4096-6143 | 10 | 11 |
| 25 | 6144-8191 | 11 | 11 |
| 26 | 9182-12287 | 10 | 12 |
| 27 | 12288-16383 | 11 | 12 |
| 28 | 16384-24575 | 10 | 13 |
| 29 | 24576-32767 | 11 | 13 |

*FIG. 19*

INSTRUCTION AND LOGIC FOR ACCELERATED COMPRESSED DATA DECODING

FIELD OF THE INVENTION

The present disclosure pertains to the field of processing logic, microprocessors, and associated instruction set architecture that, when executed by the processor or other processing logic, perform logical, mathematical, or other functional operations.

DESCRIPTION OF RELATED ART

Multiprocessor systems are becoming more and more common. Applications of multiprocessor systems include dynamic domain partitioning all the way down to desktop computing. Processors may utilize storage for decoding compressed data. Furthermore, processors may utilize serial processing to decode compressed data. Data may be compressed using the DEFLATE algorithm. Algorithms may employ Huffman encoding to reduce the size of data. Compressed data decoding may be used in media processing such as image processing or video processing. Wearables, internet-of-things (IoT), and ubiquitous sensing systems may include Huffman encoding and decoding.

DESCRIPTION OF THE FIGURES

Embodiments are illustrated by way of example and not limitation in the Figures of the accompanying drawings:

FIG. 1C illustrates other embodiments of a data processing system for performing text string comparison operations;

FIG. 17 is a table summarizing the length code translation, in accordance with the embodiments of the present disclosure.

FIG. 19 is a table summarizing distance code translation, in accordance with embodiments of the present disclosure.

DETAILED DESCRIPTION

Figure 1A:
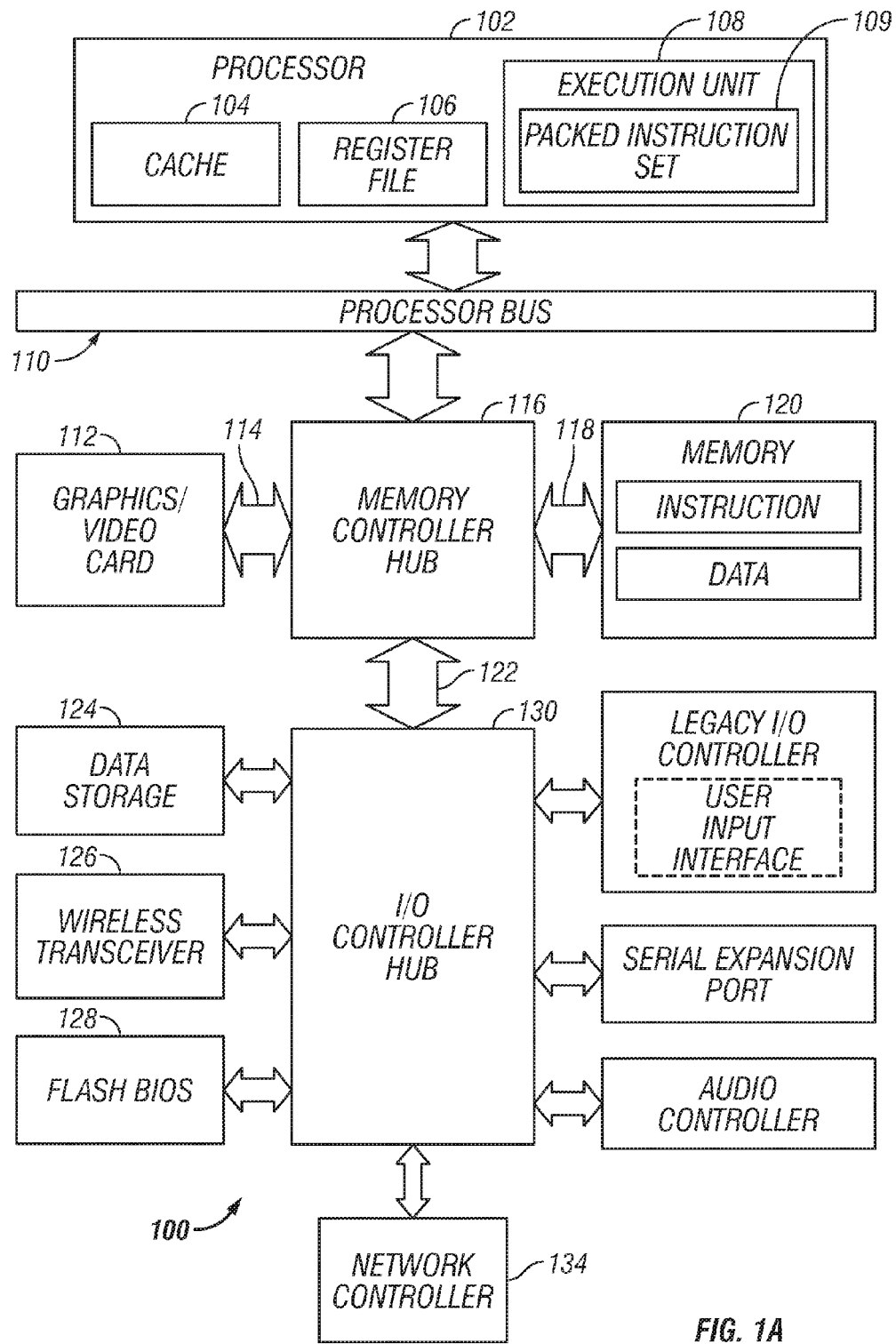
FIG. 1A is a block diagram of an exemplary computer system formed with a processor that may include execution units to execute an instruction, in accordance with embodiments of the present disclosure.

The following description describes an instruction and processing logic for compressed data decoders. The instruction and processing logic may be implemented on an out-of-order processor. In the following description, numerous specific details such as processing logic, processor types, micro-architectural conditions, events, enablement mechanisms, and the like are set forth in order to provide a more thorough understanding of embodiments of the present disclosure. It will be appreciated, however, by one skilled in the art that the embodiments may be practiced without such specific details. Additionally, some well-known structures, circuits, and the like have not been shown in detail to avoid unnecessarily obscuring embodiments of the present disclosure.

Although the following embodiments are described with reference to a processor, other embodiments are applicable to other types of integrated circuits and logic devices. Similar techniques and teachings of embodiments of the present disclosure may be applied to other types of circuits or semiconductor devices that may benefit from higher pipeline throughput and improved performance. The teachings of embodiments of the present disclosure are applicable to any processor or machine that performs data manipulations. However, the embodiments are not limited to processors or machines that perform 512-bit, 256-bit, 128-bit, 64-bit, 32-bit, or 16-bit data operations and may be applied to any processor and machine in which manipulation or management of data may be performed. In addition, the following description provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure may be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions may be used to cause a general-purpose or special-purpose processor that may be programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Furthermore, steps of embodiments of the present disclosure might be performed by specific hardware components that contain fixed-function logic for performing the steps, or by any combination of programmed computer components and fixed-function hardware components.

Instructions used to program logic to perform embodiments of the present disclosure may be stored within a memory in the system, such as DRAM, cache, flash memory, or other storage. Furthermore, the instructions may be distributed via a network or by way of other computer-readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium may include any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as may be useful in simulations, the hardware may be represented using a hardware description language or another functional description language. Additionally, a circuit level model with logic and/or transistor gates may be produced at some stages of the design process. Furthermore, designs, at some stage, may reach a level of data representing the physical placement of various devices in the hardware model. In cases wherein some semiconductor fabrication techniques are used, the data representing the hardware model may be the data specifying the presence or absence of various features on different mask layers for masks used to produce the integrated circuit. In any representation of the design, the data may be stored in any form of a machine-readable medium. A memory or a magnetic or optical storage such as a disc may be the machine-readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy may be made. Thus, a communication provider or a network provider may store on a tangible, machine-readable medium, at least temporarily, an article, such as information encoded into a carrier wave, embodying techniques of embodiments of the present disclosure.

In modern processors, a number of different execution units may be used to process and execute a variety of code and instructions. Some instructions may be quicker to complete while others may take a number of clock cycles to complete. The faster the throughput of instructions, the better the overall performance of the processor. Thus it would be advantageous to have as many instructions execute as fast as possible. However, there may be certain instructions that have greater complexity and require more in terms of execution time and processor resources, such as floating point instructions, load/store operations, data moves, etc.

As more computer systems are used in internet, text, and multimedia applications, additional processor support has been introduced over time. In one embodiment, an instruction set may be associated with one or more computer architectures, including data types, instructions, register architecture, addressing modes, memory architecture, interrupt and exception handling, and external input and output (I/O).

In one embodiment, the instruction set architecture (ISA) may be implemented by one or more micro-architectures, which may include processor logic and circuits used to implement one or more instruction sets. Accordingly, processors with different micro-architectures may share at least a portion of a common instruction set. For example, Intel® Pentium 4 processors, Intel® Core™ processors, and processors from Advanced Micro Devices, Inc. of Sunnyvale Calif. implement nearly identical versions of the x86 instruction set (with some extensions that have been added with newer versions), but have different internal designs. Similarly, processors designed by other processor development companies, such as ARM Holdings, Ltd., MIPS, or their licensees or adopters, may share at least a portion a common instruction set, but may include different processor designs. For example, the same register architecture of the ISA may be implemented in different ways in different micro-architectures using new or well-known techniques, including dedicated physical registers, one or more dynamically allocated physical registers using a register renaming mechanism (e.g., the use of a Register Alias Table (RAT), a Reorder Buffer (ROB) and a retirement register file. In one embodiment, registers may include one or more registers, register architectures, register files, or other register sets that may or may not be addressable by a software programmer.

An instruction may include one or more instruction formats. In one embodiment, an instruction format may indicate various fields (number of bits, location of bits, etc.) to specify, among other things, the operation to be performed and the operands on which that operation will be performed. In a further embodiment, some instruction formats may be further defined by instruction templates (or sub-formats). For example, the instruction templates of a given instruction format may be defined to have different subsets of the instruction format's fields and/or defined to have a given field interpreted differently. In one embodiment, an instruction may be expressed using an instruction format (and, if defined, in a given one of the instruction templates of that instruction format) and specifies or indicates the operation and the operands upon which the operation will operate.

Scientific, financial, auto-vectorized general purpose, RMS (recognition, mining, and synthesis), and visual and multimedia applications (e.g., 2D/3D graphics, image processing, video compression/decompression, voice recognition algorithms and audio manipulation) may require the same operation to be performed on a large number of data items. In one embodiment, Single Instruction Multiple Data (SIMD) refers to a type of instruction that causes a processor to perform an operation on multiple data elements. SIMD technology may be used in processors that may logically divide the bits in a register into a number of fixed-sized or variable-sized data elements, each of which represents a separate value. For example, in one embodiment, the bits in a 64-bit register may be organized as a source operand containing four separate 16-bit data elements, each of which represents a separate 16-bit value. This type of data may be referred to as 'packed' data type or 'vector' data type, and operands of this data type may be referred to as packed data operands or vector operands. In one embodiment, a packed data item or vector may be a sequence of packed data elements stored within a single register, and a packed data operand or a vector operand may a source or destination operand of a SIMD instruction (or 'packed data instruction' or a 'vector instruction'). In one embodiment, a SIMD instruction specifies a single vector operation to be performed on two source vector operands to generate a destination vector operand (also referred to as a result vector operand) of the same or different size, with the same or different number of data elements, and in the same or different data element order.

SIMD technology, such as that employed by the Intel® Core™ processors having an instruction set including x86, MMX™, Streaming SIMD Extensions (SSE), SSE2, SSE3, SSE4.1, and SSE4.2 instructions, ARM processors, such as the ARM Cortex® family of processors having an instruction set including the Vector Floating Point (VFP) and/or NEON instructions, and MIPS processors, such as the Loongson family of processors developed by the Institute of Computing Technology (ICT) of the Chinese Academy of Sciences, has enabled a significant improvement in application performance (Core™ and MMX™ are registered trademarks or trademarks of Intel Corporation of Santa Clara, Calif.).

In one embodiment, destination and source registers/data may be generic terms to represent the source and destination of the corresponding data or operation. In some embodiments, they may be implemented by registers, memory, or other storage areas having other names or functions than those depicted. For example, in one embodiment, "DEST1" may be a temporary storage register or other storage area, whereas "SRC1" and "SRC2" may be a first and second source storage register or other storage area, and so forth. In other embodiments, two or more of the SRC and DEST storage areas may correspond to different data storage elements within the same storage area (e.g., a SIMD register). In one embodiment, one of the source registers may also act as a destination register by, for example, writing back the result of an operation performed on the first and second source data to one of the two source registers serving as a destination registers.

FIG. 1A is a block diagram of an exemplary computer system formed with a processor that may include execution units to execute an instruction, in accordance with embodiments of the present disclosure. System 100 may include a component, such as a processor 102 to employ execution units including logic to perform algorithms for process data, in accordance with the present disclosure, such as in the embodiment described herein. System 100 may be representative of processing systems based on the PENTIUM® III, PENTIUM® 4, Xeon™, Itanium®, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 100 may execute a version of the WINDOWS™ operating system available from Microsoft Corporation of Redmond, Wash., although other operating systems (UNIX and Linux for example), embedded software, and/or graphical user interfaces, may also be used. Thus, embodiments of the present disclosure are not limited to any specific combination of hardware circuitry and software.

Embodiments are not limited to computer systems. Embodiments of the present disclosure may be used in other devices such as handheld devices and embedded applications. Some examples of handheld devices include cellular phones, Internet Protocol devices, digital cameras, personal digital assistants (PDAs), and handheld PCs. Embedded applications may include a micro controller, a digital signal processor (DSP), system on a chip, network computers (NetPC), set-top boxes, network hubs, wide area network (WAN) switches, or any other system that may perform one or more instructions in accordance with at least one embodiment.

Computer system 100 may include a processor 102 that may include one or more execution units 108 to perform an algorithm to perform at least one instruction in accordance with one embodiment of the present disclosure. One embodiment may be described in the context of a single processor desktop or server system, but other embodiments may be included in a multiprocessor system. System 100 may be an example of a 'hub' system architecture. System 100 may include a processor 102 for processing data signals. Processor 102 may include a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. In one embodiment, processor 102 may be coupled to a processor bus 110 that may transmit data signals between processor 102 and other components in system 100. The elements of system 100 may perform conventional functions that are well known to those familiar with the art.

In one embodiment, processor 102 may include a Level 1 (L1) internal cache memory 104. Depending on the architecture, the processor 102 may have a single internal cache or multiple levels of internal cache. In another embodiment, the cache memory may reside external to processor 102. Other embodiments may also include a combination of both internal and external caches depending on the particular implementation and needs. Register file 106 may store different types of data in various registers including integer registers, floating point registers, status registers, and instruction pointer register.

Execution unit 108, including logic to perform integer and floating point operations, also resides in processor 102. Processor 102 may also include a microcode (ucode) ROM that stores microcode for certain macroinstructions. In one embodiment, execution unit 108 may include logic to handle a packed instruction set 109. By including the packed instruction set 109 in the instruction set of a general-purpose processor 102, along with associated circuitry to execute the instructions, the operations used by many multimedia applications may be performed using packed data in a general-purpose processor 102. Thus, many multimedia applications may be accelerated and executed more efficiently by using the full width of a processor's data bus for performing operations on packed data. This may eliminate the need to transfer smaller units of data across the processor's data bus to perform one or more operations one data element at a time.

Embodiments of an execution unit 108 may also be used in micro controllers, embedded processors, graphics devices, DSPs, and other types of logic circuits. System 100 may include a memory 120. Memory 120 may be implemented as a Dynamic Random Access Memory (DRAM) device, a Static Random Access Memory (SRAM) device, flash memory device, or other memory device. Memory 120 may store instructions and/or data represented by data signals that may be executed by processor 102.

A system logic chip 116 may be coupled to processor bus 110 and memory 120. System logic chip 116 may include a memory controller hub (MCH). Processor 102 may communicate with MCH 116 via a processor bus 110. MCH 116 may provide a high bandwidth memory path 118 to memory 120 for instruction and data storage and for storage of graphics commands, data and textures. MCH 116 may direct data signals between processor 102, memory 120, and other components in system 100 and to bridge the data signals between processor bus 110, memory 120, and system I/O 122. In some embodiments, the system logic chip 116 may provide a graphics port for coupling to a graphics controller 112. MCH 116 may be coupled to memory 120 through a memory interface 118. Graphics card 112 may be coupled to MCH 116 through an Accelerated Graphics Port (AGP) interconnect 114.

System 100 may use a proprietary hub interface bus 122 to couple MCH 116 to I/O controller hub (ICH) 130. In one embodiment, ICH 130 may provide direct connections to some I/O devices via a local I/O bus. The local I/O bus may include a high-speed I/O bus for connecting peripherals to memory 120, chipset, and processor 102. Examples may include the audio controller, firmware hub (flash BIOS) 128, wireless transceiver 126, data storage 124, legacy I/O controller containing user input and keyboard interfaces, a serial expansion port such as Universal Serial Bus (USB), and a network controller 134. Data storage device 124 may comprise a hard disk drive, a floppy disk drive, a CD-ROM device, a flash memory device, or other mass storage device.

For another embodiment of a system, an instruction in accordance with one embodiment may be used with a system on a chip. One embodiment of a system on a chip comprises of a processor and a memory. The memory for one such system may include a flash memory. The flash memory may be located on the same die as the processor and other system components. Additionally, other logic blocks such as a memory controller or graphics controller may also be located on a system on a chip.

Figure 1B:
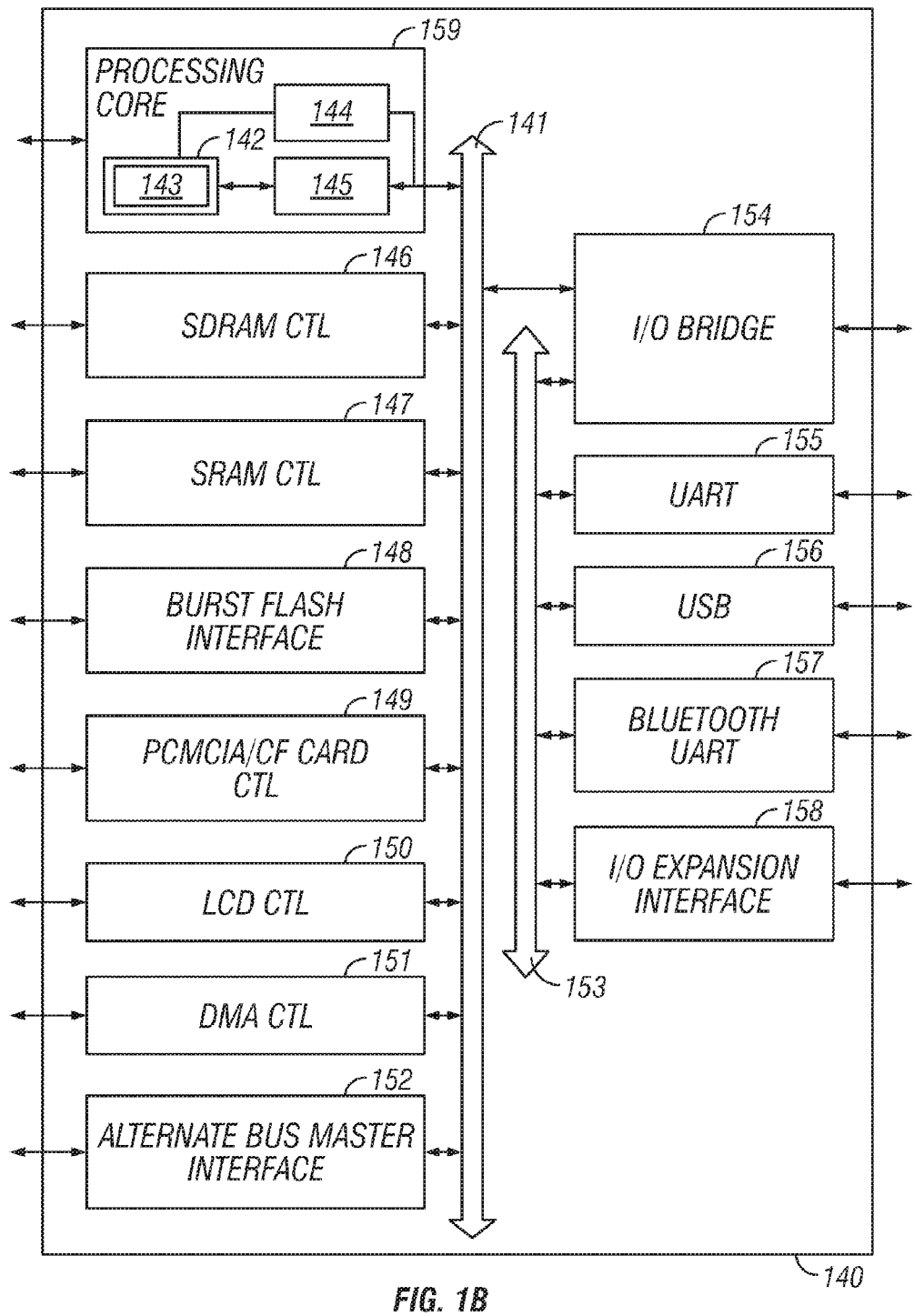
FIG. 1B illustrates a data processing system, in accordance with embodiments of the present disclosure.

FIG. 1B illustrates a data processing system 140 which implements the principles of embodiments of the present disclosure. It will be readily appreciated by one of skill in the art that the embodiments described herein may operate with alternative processing systems without departure from the scope of embodiments of the disclosure.

Computer system 140 comprises a processing core 159 for performing at least one instruction in accordance with one embodiment. In one embodiment, processing core 159 represents a processing unit of any type of architecture, including but not limited to a CISC, a RISC or a VLIW-type architecture. Processing core 159 may also be suitable for manufacture in one or more process technologies and by being represented on a machine-readable media in sufficient detail, may be suitable to facilitate said manufacture.

Processing core 159 comprises an execution unit 142, a set of register files 145, and a decoder 144. Processing core 159 may also include additional circuitry (not shown) which may be unnecessary to the understanding of embodiments of the present disclosure. Execution unit 142 may execute instructions received by processing core 159. In addition to performing typical processor instructions, execution unit 142 may perform instructions in packed instruction set 143 for performing operations on packed data formats. Packed instruction set 143 may include instructions for performing embodiments of the disclosure and other packed instructions. Execution unit 142 may be coupled to register file 145 by an internal bus. Register file 145 may represent a storage area on processing core 159 for storing information, including data. As previously mentioned, it is understood that the storage area may store the packed data might not be critical. Execution unit 142 may be coupled to decoder 144. Decoder 144 may decode instructions received by processing core 159 into control signals and/or microcode entry points. In response to these control signals and/or microcode entry points, execution unit 142 performs the appropriate operations. In one embodiment, the decoder may interpret the opcode of the instruction, which will indicate what operation should be performed on the corresponding data indicated within the instruction.

Processing core 159 may be coupled with bus 141 for communicating with various other system devices, which may include but are not limited to, for example, Synchronous Dynamic Random Access Memory (SDRAM) control 146, Static Random Access Memory (SRAM) control 147, burst flash memory interface 148, Personal Computer Memory Card International Association (PCMCIA)/Compact Flash (CF) card control 149, Liquid Crystal Display (LCD) control 150, Direct Memory Access (DMA) controller 151, and alternative bus master interface 152. In one embodiment, data processing system 140 may also comprise an I/O bridge 154 for communicating with various I/O devices via an I/O bus 153. Such I/O devices may include but are not limited to, for example, Universal Asynchronous Receiver/Transmitter (UART) 155, Universal Serial Bus (USB) 156, Bluetooth wireless UART 157 and I/O expansion interface 158.

One embodiment of data processing system 140 provides for mobile, network and/or wireless communications and a processing core 159 that may perform SIMD operations including a text string comparison operation. Processing core 159 may be programmed with various audio, video, imaging and communications algorithms including discrete transformations such as a Walsh-Hadamard transform, a fast Fourier transform (FFT), a discrete cosine transform (DCT), and their respective inverse transforms; compression/decompression techniques such as color space transformation, video encode motion estimation or video decode motion compensation; and modulation/demodulation (MODEM) functions such as pulse coded modulation (PCM).

FIG. 1C illustrates other embodiments of a data processing system that performs SIMD text string comparison operations. In one embodiment, data processing system 160 may include a main processor 166, a SIMD coprocessor 161, a cache memory 167, and an input/output system 168. Input/output system 168 may optionally be coupled to a wireless interface 169. SIMD coprocessor 161 may perform operations including instructions in accordance with one embodiment. In one embodiment, processing core 170 may be suitable for manufacture in one or more process technologies and by being represented on a machine-readable media in sufficient detail, may be suitable to facilitate the manufacture of all or part of data processing system 160 including processing core 170.

In one embodiment, SIMD coprocessor 161 comprises an execution unit 162 and a set of register files 164. One embodiment of main processor 165 comprises a decoder 165 to recognize instructions of instruction set 163 including instructions in accordance with one embodiment for execution by execution unit 162. In other embodiments, SIMD coprocessor 161 also comprises at least part of decoder 165 to decode instructions of instruction set 163. Processing core 170 may also include additional circuitry (not shown) which may be unnecessary to the understanding of embodiments of the present disclosure.

In operation, main processor 166 executes a stream of data processing instructions that control data processing operations of a general type including interactions with cache memory 167, and input/output system 168. Embedded within the stream of data processing instructions may be SIMD coprocessor instructions. Decoder 165 of main processor 166 recognizes these SIMD coprocessor instructions as being of a type that should be executed by an attached SIMD coprocessor 161. Accordingly, main processor 166 issues these SIMD coprocessor instructions (or control signals representing SIMD coprocessor instructions) on the coprocessor bus 171. From coprocessor bus 171, these instructions may be received by any attached SIMD coprocessors. In this case, SIMD coprocessor 161 may accept and execute any received SIMD coprocessor instructions intended for it.

Data may be received via wireless interface 169 for processing by the SIMD coprocessor instructions. For one example, voice communication may be received in the form of a digital signal, which may be processed by the SIMD coprocessor instructions to regenerate digital audio samples representative of the voice communications. For another example, compressed audio and/or video may be received in the form of a digital bit stream, which may be processed by the SIMD coprocessor instructions to regenerate digital audio samples and/or motion video frames. In one embodiment of processing core 170, main processor 166, and a SIMD coprocessor 161 may be integrated into a single processing core 170 comprising an execution unit 162, a set of register files 164, and a decoder 165 to recognize instructions of instruction set 163 including instructions in accordance with one embodiment.

Figure 2:
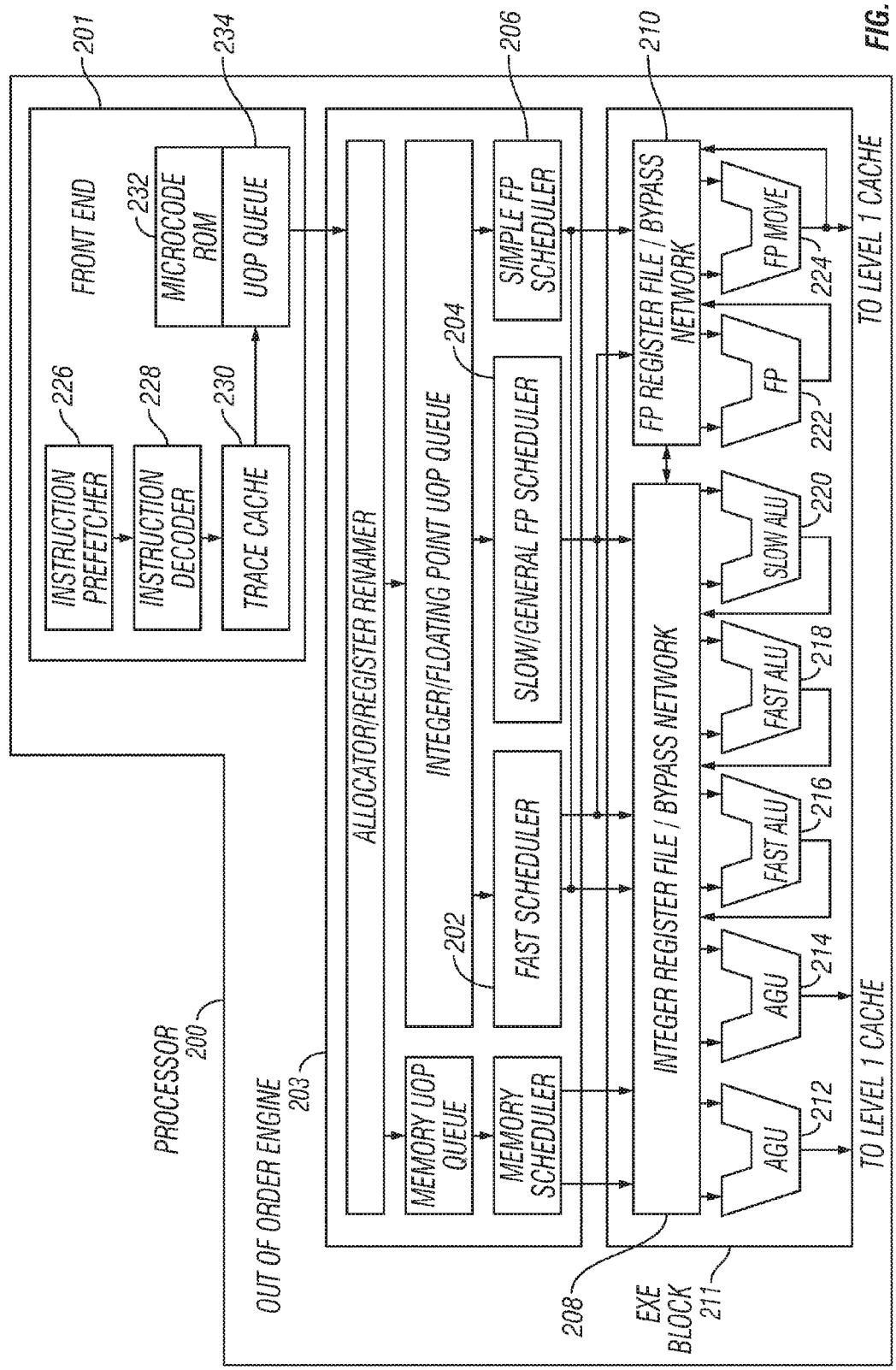
FIG. 2 is a block diagram of the micro-architecture for a processor that may include logic circuits to perform instructions, in accordance with embodiments of the present disclosure.

FIG. 2 is a block diagram of the micro-architecture for a processor 200 that may include logic circuits to perform instructions, in accordance with embodiments of the present disclosure. In some embodiments, an instruction in accordance with one embodiment may be implemented to operate on data elements having sizes of byte, word, doubleword, quadword, etc., as well as datatypes, such as single and double precision integer and floating point datatypes. In one embodiment, in-order front end 201 may implement a part of processor 200 that may fetch instructions to be executed and prepares the instructions to be used later in the processor pipeline. Front end 201 may include several units. In one embodiment, instruction prefetcher 226 fetches instructions from memory and feeds the instructions to an instruction decoder 228 which in turn decodes or interprets the instructions. For example, in one embodiment, the decoder decodes a received instruction into one or more operations called "micro-instructions" or "micro-operations" (also called micro op or uops) that the machine may execute. In other embodiments, the decoder parses the instruction into an opcode and corresponding data and control fields that may be used by the micro-architecture to perform operations in accordance with one embodiment. In one embodiment, trace cache 230 may assemble decoded uops into program ordered sequences or traces in uop queue 234 for execution. When trace cache 230 encounters a complex instruction, microcode ROM 232 provides the uops needed to complete the operation.

Some instructions may be converted into a single micro-op, whereas others need several micro-ops to complete the full operation. In one embodiment, if more than four micro-ops are needed to complete an instruction, decoder 228 may access microcode ROM 232 to perform the instruction. In one embodiment, an instruction may be decoded into a small number of micro-ops for processing at instruction decoder 228. In another embodiment, an instruction may be stored within microcode ROM 232 should a number of micro-ops be needed to accomplish the operation. Trace cache 230 refers to an entry point programmable logic array (PLA) to determine a correct micro-instruction pointer for reading the micro-code sequences to complete one or more instructions in accordance with one embodiment from micro-code ROM 232. After microcode ROM 232 finishes sequencing micro-ops for an instruction, front end 201 of the machine may resume fetching micro-ops from trace cache 230.

Out-of-order execution engine 203 may prepare instructions for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 202, slow/general floating point scheduler 204, and simple floating point scheduler 206. Uop schedulers 202, 204, 206, determine when a uop is ready to execute based on the readiness of their dependent input register operand sources and the availability of the execution resources the uops need to complete their operation. Fast scheduler 202 of one embodiment may schedule on each half of the main clock cycle while the other schedulers may only schedule once per main processor clock cycle. The schedulers arbitrate for the dispatch ports to schedule uops for execution.

Register files 208, 210 may be arranged between schedulers 202, 204, 206, and execution units 212, 214, 216, 218, 220, 222, 224 in execution block 211. Each of register files 208, 210 perform integer and floating point operations, respectively. Each register file 208, 210, may include a bypass network that may bypass or forward just completed results that have not yet been written into the register file to new dependent uops. Integer register file 208 and floating point register file 210 may communicate data with the other. In one embodiment, integer register file 208 may be split into two separate register files, one register file for low-order thirty-two bits of data and a second register file for high order thirty-two bits of data. Floating point register file 210 may include 128-bit wide entries because floating point instructions typically have operands from 64 to 128 bits in width.

Execution block 211 may contain execution units 212, 214, 216, 218, 220, 222, 224. Execution units 212, 214, 216, 218, 220, 222, 224 may execute the instructions. Execution block 211 may include register files 208, 210 that store the integer and floating point data operand values that the micro-instructions need to execute. In one embodiment, processor 200 may comprise a number of execution units: address generation unit (AGU) 212, AGU 214, fast Arithmetic Logic Unit (ALU) 216, fast ALU 218, slow ALU 220, floating point ALU 222, floating point move unit 224. In another embodiment, floating point execution blocks 222, 224, may execute floating point, MMX, SIMD, and SSE, or other operations. In yet another embodiment, floating point ALU 222 may include a 64-bit by 64-bit floating point divider to execute divide, square root, and remainder micro-ops. In various embodiments, instructions involving a floating point value may be handled with the floating point hardware. In one embodiment, ALU operations may be passed to high-speed ALU execution units 216, 218. High-speed ALUs 216, 218 may execute fast operations with an effective latency of half a clock cycle. In one embodiment, most complex integer operations go to slow ALU 220 as slow ALU 220 may include integer execution hardware for long-latency type of operations, such as a multiplier, shifts, flag logic, and branch processing. Memory load/store operations may be executed by AGUs 212, 214. In one embodiment, integer ALUs 216, 218, 220 may perform integer operations on 64-bit data operands. In other embodiments, ALUs 216, 218, 220 may be implemented to support a variety of data bit sizes including sixteen, thirty-two, 128, 256, etc. Similarly, floating point units 222, 224 may be implemented to support a range of operands having bits of various widths. In one embodiment, floating point units 222, 224, may operate on 128-bit wide packed data operands in conjunction with SIMD and multimedia instructions.

In one embodiment, uops schedulers 202, 204, 206, dispatch dependent operations before the parent load has finished executing. As uops may be speculatively scheduled and executed in processor 200, processor 200 may also include logic to handle memory misses. If a data load misses in the data cache, there may be dependent operations in flight in the pipeline that have left the scheduler with temporarily incorrect data. A replay mechanism tracks and re-executes instructions that use incorrect data. Only the dependent operations might need to be replayed and the independent ones may be allowed to complete. The schedulers and replay mechanism of one embodiment of a processor may also be designed to catch instruction sequences for text string comparison operations.

The term "registers" may refer to the on-board processor storage locations that may be used as part of instructions to identify operands. In other words, registers may be those that may be usable from the outside of the processor (from a programmer's perspective). However, in some embodiments registers might not be limited to a particular type of circuit. Rather, a register may store data, provide data, and perform the functions described herein. The registers described herein may be implemented by circuitry within a processor using any number of different techniques, such as dedicated physical registers, dynamically allocated physical registers using register renaming, combinations of dedicated and dynamically allocated physical registers, etc. In one embodiment, integer registers store 32-bit integer data. A register file of one embodiment also contains eight multimedia SIMD registers for packed data. For the discussions below, the registers may be understood to be data registers designed to hold packed data, such as 64-bit wide MMX™ registers (also referred to as 'mm' registers in some instances) in microprocessors enabled with MMX technology from Intel Corporation of Santa Clara, Calif. These MMX registers, available in both integer and floating point forms, may operate with packed data elements that accompany SIMD and SSE instructions. Similarly, 128-bit wide XMM registers relating to SSE2, SSE3, SSE4, or beyond (referred to generically as "SSEx") technology may hold such packed data operands. In one embodiment, in storing packed data and integer data, the registers do not need to differentiate between the two data types. In one embodiment, integer and floating point may be contained in the same register file or different register files. Furthermore, in one embodiment, floating point and integer data may be stored in different registers or the same registers.

Figure 3A:
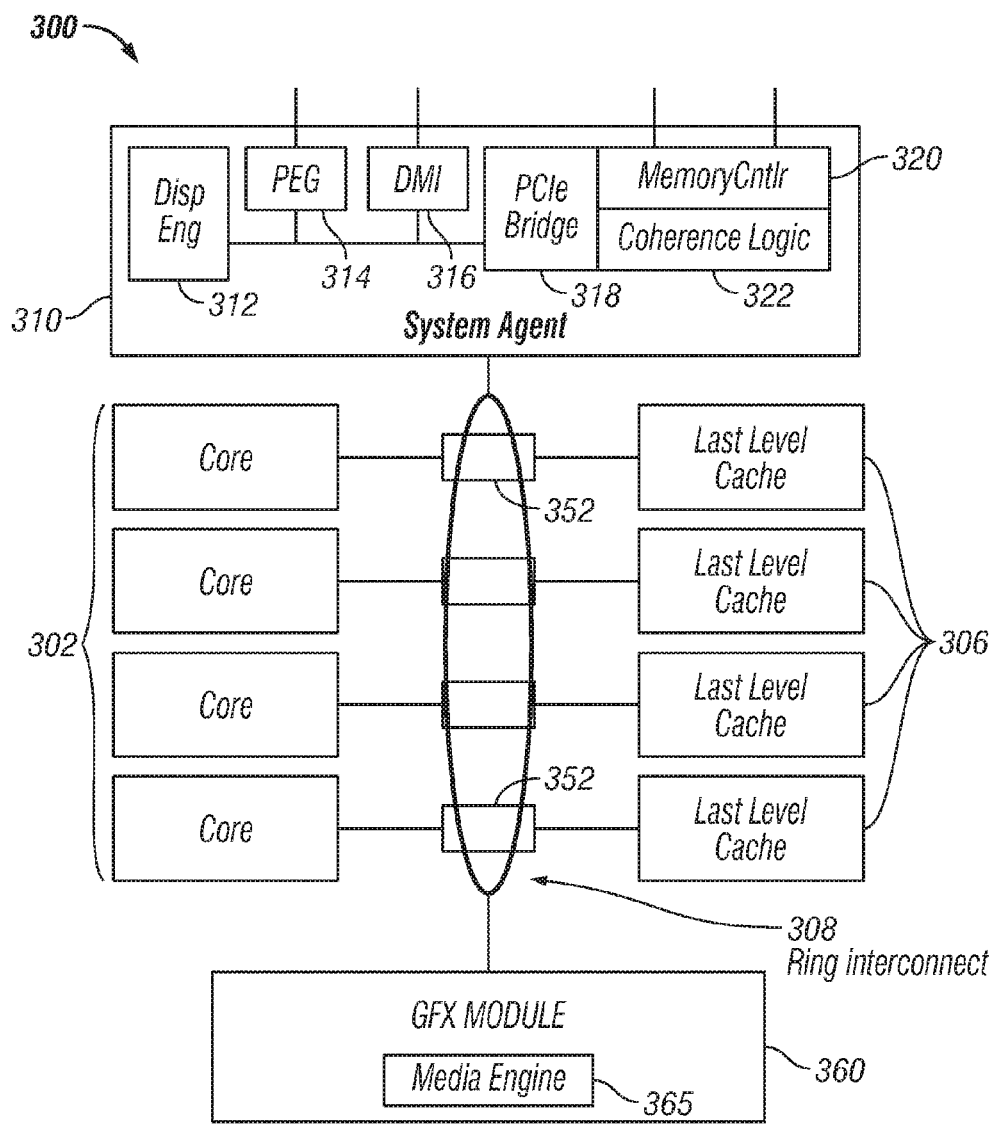
FIG. 3A is a block diagram of a processor, in accordance with embodiments of the present disclosure.
Figure 3B:
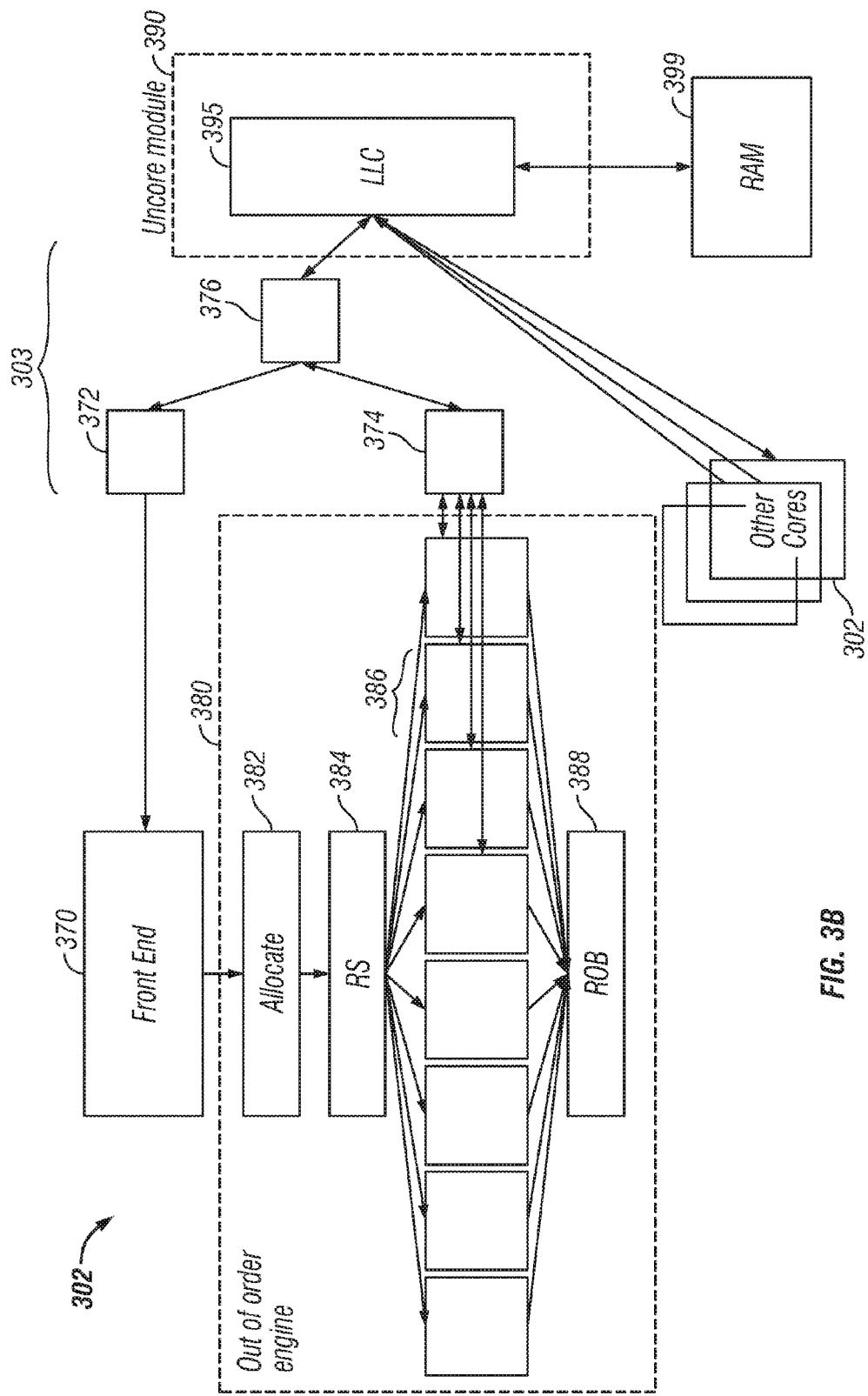
FIG. 3B is a block diagram of an example implementation of a core, in accordance with embodiments of the present disclosure.
Figure 4:
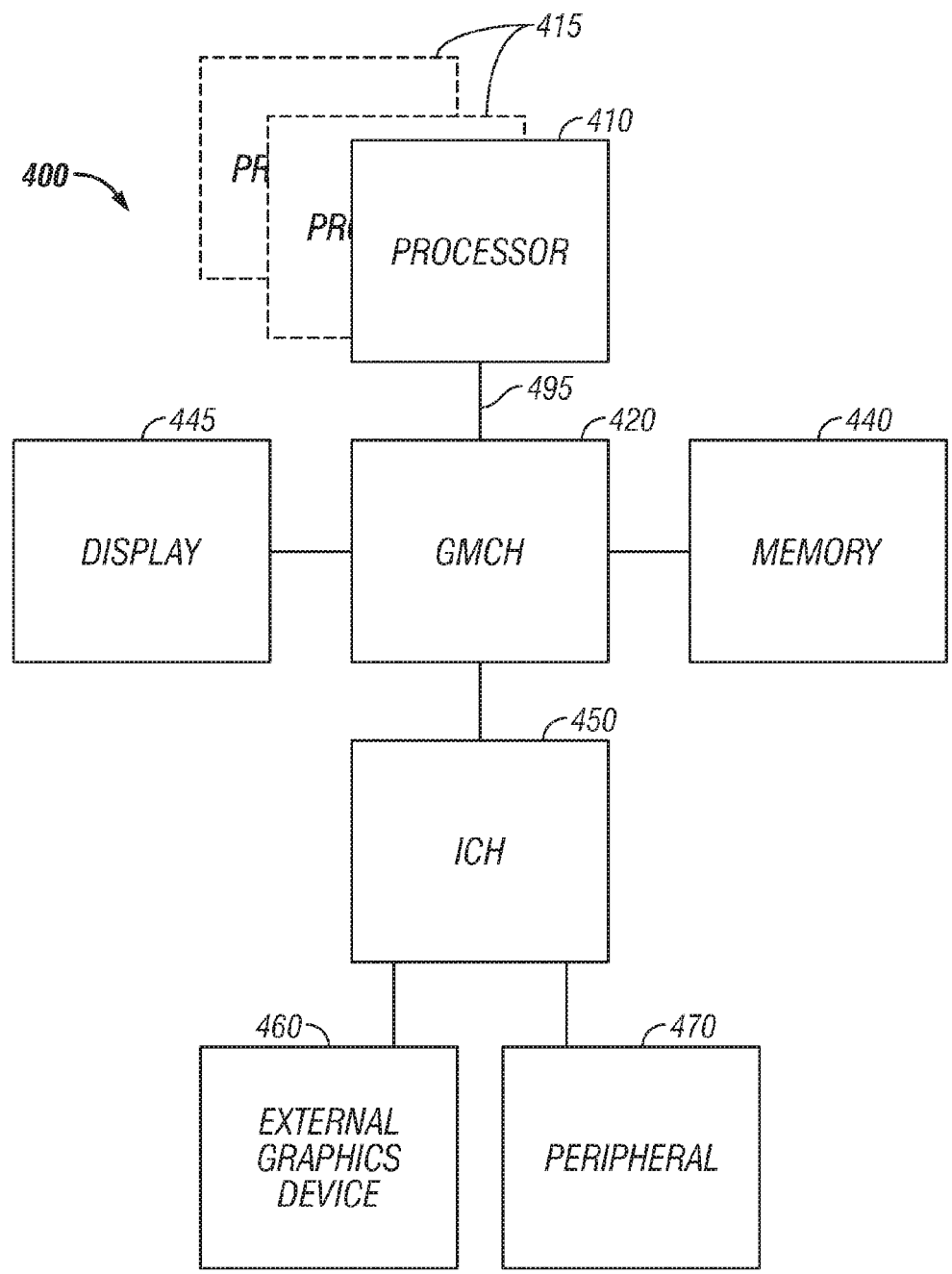
FIG. 4 is a block diagram of a system, in accordance with embodiments of the present disclosure.
Figure 5:
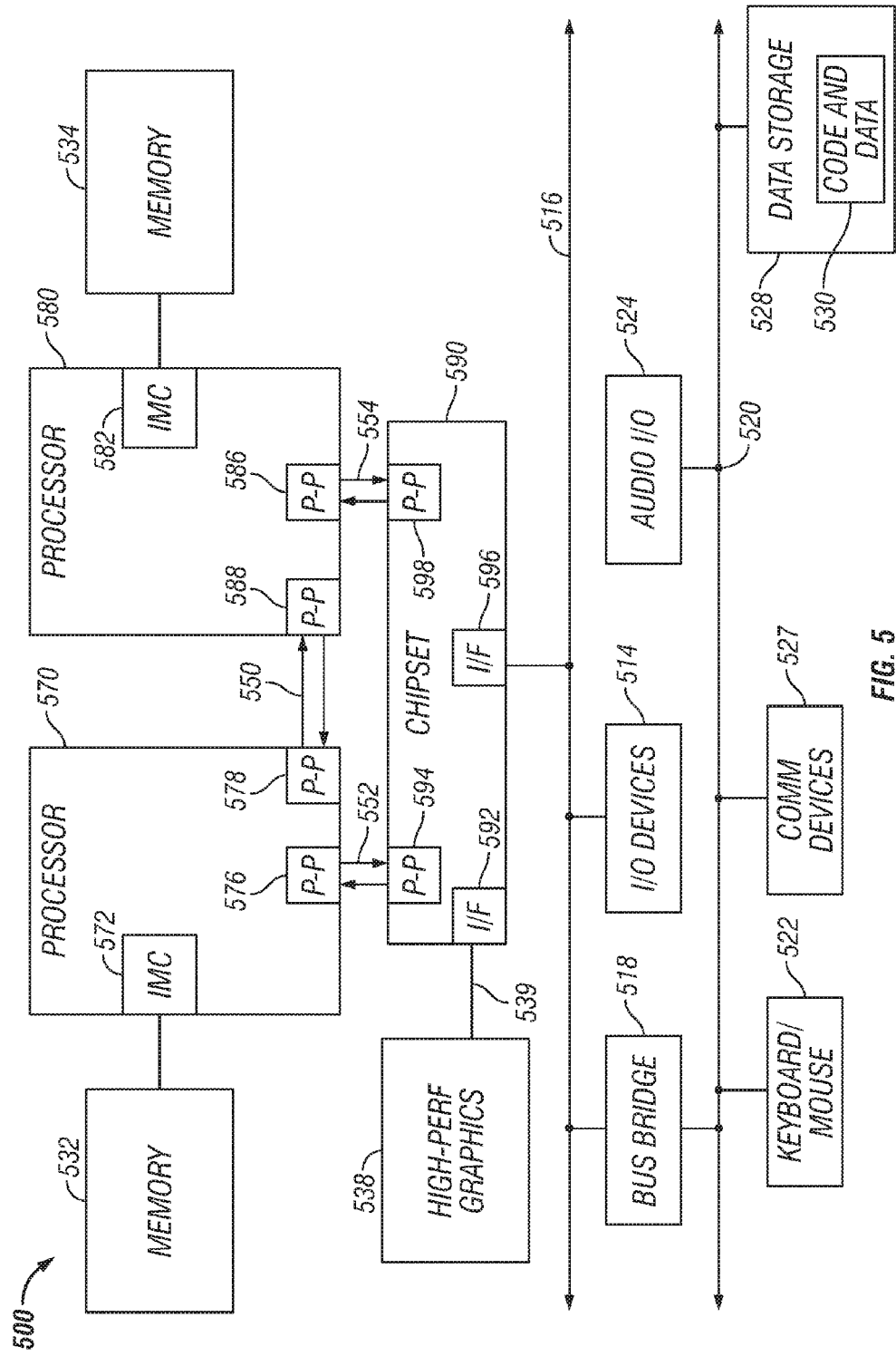
FIG. 5 is a block diagram of a second system, in accordance with embodiments of the present disclosure.

FIGS. 3-5 may illustrate exemplary systems suitable for including processor 300, while FIG. 4 may illustrate an exemplary System on a Chip (SoC) that may include one or more of cores 302. Other system designs and implementations known in the arts for laptops, desktops, handheld PCs, personal digital assistants, engineering workstations, servers, network devices, network hubs, switches, embedded processors, DSPs, graphics devices, video game devices, set-top boxes, micro controllers, cell phones, portable media players, hand held devices, and various other electronic devices, may also be suitable. In general, a huge variety of systems or electronic devices that incorporate a processor and/or other execution logic as disclosed herein may be generally suitable.

FIG. 3A is a block diagram of a processor 300, in accordance with embodiments of the present disclosure. In one embodiment, processor 300 may include a multicore processor. Processor 300 may include a system agent 310 communicatively coupled to one or more cores 302. Furthermore, cores 302 and system agent 310 may be communicatively coupled to one or more caches 306. Cores 302, system agent 310, and caches 306 may be communicatively coupled via one or more memory control units 352. Furthermore, cores 302, system agent 310, and caches 306 may be communicatively coupled to a graphics module 360 via memory control units 352.

Processor 300 may include any suitable mechanism for interconnecting cores 02, system agent 310, and caches 306, and graphics module 360. In one embodiment, processor 300 may include a ring-based interconnect unit 308 to interconnect cores 302, system agent 310, and caches 306, and graphics module 360. In other embodiments, processor 300 may include any number of well-known techniques for interconnecting such units. Ring-based interconnect unit 308 may utilize memory control units 352 to facilitate interconnections.

Processor 300 may include a memory hierarchy comprising one or more levels of caches within the cores, one or more shared cache units such as caches 306, or external memory (not shown) coupled to the set of integrated memory controller units 352. Caches 306 may include any suitable cache. In one embodiment, caches 306 may include one or more mid-level caches, such as level 2 (L2), level 3 (L3), level 4 (L4), or other levels of cache, a last level cache (LLC), and/or combinations thereof.

In various embodiments, one or more of cores 302 may perform multi-threading. System agent 310 may include components for coordinating and operating cores 302. System agent unit 310 may include for example a power control unit (PCU). The PCU may be or include logic and components needed for regulating the power state of cores 302. System agent 310 may include a display engine 312 for driving one or more externally connected displays or graphics module 360. System agent 310 may include an interface for communications busses for graphics. In one embodiment (not shown), the interface may be implemented by PCI Express (PCIe). In a further embodiment, the interface may be implemented by PCI Express Graphics (PEG) 314. System agent 510 may include a direct media interface (DMI) 516. DMI 516 may provide links between different bridges on a motherboard or other portion of a computer system. System agent 510 may include a PCIe Bridge 318 for providing PCIe links to other elements of a computing system. PCIe Bridge 318 may be implemented using a memory controller 320 and coherence logic 322.

Cores 302 may be implemented in any suitable manner. Cores 302 may be homogenous or heterogeneous in terms of architecture and/or instruction set. In one embodiment, some of cores 302 may be in-order while others may be out-of-order. In another embodiment, two or more of cores 302 may execute the same instruction set, while others may execute only a subset of that instruction set or a different instruction set.

Processor 300 may include a general-purpose processor, such as a Core™ i3, i5, i7, 2 Duo and Quad, Xeon™, Itanium™, XScale™ or StrongARM™ processor, which may be available from Intel Corporation, of Santa Clara, Calif. Processor 300 may be provided from another company, such as ARM Holdings, Ltd, MIPS, etc. Processor 300 may be a special-purpose processor, such as, for example, a network or communication processor, compression engine, graphics processor, co-processor, embedded processor, or the like. Processor 300 may be implemented on one or more chips. Processor 300 may be a part of and/or may be implemented on one or more substrates using any of a number of process technologies, such as, for example, BiCMOS, CMOS, or NMOS.

In one embodiment, a given one of caches 306 may be shared by multiple ones of cores 302. In another embodiment, a given one of caches 306 may be dedicated to one of cores 302. The assignment of caches 306 to cores 302 may be handled by a cache controller or other suitable mechanism. A given one of caches 306 may be shared by two or more cores 302 by implementing time-slices of a given cache 306.

Graphics module 360 may implement an integrated graphics processing subsystem. In one embodiment, graphics module 360 may include a graphics processor. Furthermore, graphics module 360 may include a media engine 365. Media engine 365 may provide media encoding and video decoding.

FIG. 3B is a block diagram of an example implementation of a core 302, in accordance with embodiments of the present disclosure. Core 302 may include a front end 370 communicatively coupled to an out-of-order engine 380. Core 302 may be communicatively coupled to other portions of processor 300 through cache hierarchy 303.

Front end 370 may be implemented in any suitable manner, such as fully or in part by front end 201 as described above. In one embodiment, front end 370 may communicate with other portions of processor 300 through cache hierarchy 303. In a further embodiment, front end 370 may fetch instructions from portions of processor 300 and prepare the instructions to be used later in the processor pipeline as they are passed to out-of-order execution engine 380.

Out-of-order execution engine 380 may be implemented in any suitable manner, such as fully or in part by out-of-order execution engine 203 as described above. Out-of-order execution engine 380 may prepare instructions received from front end 370 for execution. Out-of-order execution engine 380 may include an allocate module 382. In one embodiment, allocate module 382 may allocate resources of processor 300 or other resources, such as registers or buffers, to execute a given instruction. Allocate module 382 may make allocations in schedulers, such as a memory scheduler, fast scheduler, or floating point scheduler. Such schedulers may be represented in FIG. 3B by resource schedulers 384. Allocate module 382 may be implemented fully or in part by the allocation logic described in conjunction with FIG. 2. Resource schedulers 384 may determine when an instruction is ready to execute based on the readiness of a given resource's sources and the availability of execution resources needed to execute an instruction. Resource schedulers 384 may be implemented by, for example, schedulers 202, 204, 206 as discussed above. Resource schedulers 384 may schedule the execution of instructions upon one or more resources. In one embodiment, such resources may be internal to core 302, and may be illustrated, for example, as resources 386. In another embodiment, such resources may be external to core 302 and may be accessible by, for example, cache hierarchy 303. Resources may include, for example, memory, caches, register files, or registers. Resources internal to core 302 may be represented by resources 386 in FIG. 3B. As necessary, values written to or read from resources 386 may be coordinated with other portions of processor 300 through, for example, cache hierarchy 303. As instructions are assigned resources, they may be placed into a reorder buffer 388. Reorder buffer 388 may track instructions as they are executed and may selectively reorder their execution based upon any suitable criteria of processor 300. In one embodiment, reorder buffer 388 may identify instructions or a series of instructions that may be executed independently. Such instructions or a series of instructions may be executed in parallel from other such instructions. Parallel execution in core 302 may be performed by any suitable number of separate execution blocks or virtual processors. In one embodiment, shared resources—such as memory, registers, and caches—may be accessible to multiple virtual processors within a given core 302. In other embodiments, shared resources may be accessible to multiple processing entities within processor 300.

Cache hierarchy 303 may be implemented in any suitable manner. For example, cache hierarchy 303 may include one or more lower or mid-level caches, such as caches 372, 374. In one embodiment, cache hierarchy 303 may include an LLC 395 communicatively coupled to caches 372, 374. In another embodiment, LLC 395 may be implemented in a module 390 accessible to all processing entities of processor 300. In a further embodiment, module 290 may be implemented in an uncore module of processors from Intel, Inc. Module 390 may include portions or subsystems of processor 300 necessary for the execution of core 302 but might not be implemented within core 302. Besides LLC 395, module 390 may include, for example, hardware interfaces, memory coherency coordinators, interprocessor interconnects, instruction pipelines, or memory controllers. Access to RAM 399 available to processor 300 may be made through module 390 and, more specifically, LLC 395. Furthermore, other instances of core 302 may similarly access module 390. Coordination of the instances of core 302 may be facilitated in part through module 390.

FIG. 4 illustrates a block diagram of a system 400, in accordance with embodiments of the present disclosure. System 400 may include one or more processors 410, 415, which may be coupled to Graphics Memory Controller Hub (GMCH) 420. The optional nature of additional processors 415 is denoted in FIG. 4 with broken lines.

Each processor 410, 415 may be some version of processor 300. However, it should be noted that integrated graphics logic and integrated memory control units might not exist in processors 410, 415. FIG. 4 illustrates that GMCH 420 may be coupled to a memory 440 that may be, for example, a dynamic random access memory (DRAM). The DRAM may, for at least one embodiment, be associated with a non-volatile cache.

GMCH 420 may be a chipset, or a portion of a chipset. GMCH 420 may communicate with processors 410, 415 and control interaction between processors 410, 415 and memory 440. GMCH 420 may also act as an accelerated bus interface between the processors 410, 415 and other elements of system 400. In one embodiment, GMCH 420 communicates with processors 410, 415 via a multi-drop bus, such as a frontside bus (FSB) 495.

Furthermore, GMCH 420 may be coupled to a display 445 (such as a flat panel display). In one embodiment, GMCH 420 may include an integrated graphics accelerator. GMCH 420 may be further coupled to an input/output (I/O) controller hub (ICH) 450, which may be used to couple various peripheral devices to system 400. External graphics device 460 may include be a discrete graphics device coupled to ICH 450 along with another peripheral device 470.

In other embodiments, additional or different processors may also be present in system 400. For example, additional processors 410, 415 may include additional processors that may be the same as processor 410, additional processors that may be heterogeneous or asymmetric to processor 410, accelerators (such as, e.g., graphics accelerators or digital signal processing (DSP) units), field programmable gate arrays, or any other processor. There may be a variety of differences between the physical resources 410, 415 in terms of a spectrum of metrics of merit including architectural, micro-architectural, thermal, power consumption characteristics, and the like. These differences may effectively manifest themselves as asymmetry and heterogeneity amongst processors 410, 415. For at least one embodiment, various processors 410, 415 may reside in the same die package.

FIG. 5 illustrates a block diagram of a second system 500, in accordance with embodiments of the present disclosure. As shown in FIG. 5, multiprocessor system 500 may include a point-to-point interconnect system, and may include a first processor 570 and a second processor 580 coupled via a point-to-point interconnect 550. Each of processors 570 and 580 may be some version of processor 300 as one or more of processors 410, 415.

While FIG. 5 may illustrate two processors 570, 580, it is to be understood that the scope of the present disclosure is not so limited. In other embodiments, one or more additional processors may be present in a given processor.

Processors 570 and 580 are shown including integrated memory controller units 572 and 582, respectively. Processor 570 may also include as part of its bus controller units point-to-point (P-P) interfaces 576 and 578; similarly, second processor 580 may include P-P interfaces 586 and 588. Processors 570, 580 may exchange information via a point-to-point (P-P) interface 550 using P-P interface circuits 578, 588. As shown in FIG. 5, IMCs 572 and 582 may couple the processors to respective memories, namely a memory 532 and a memory 534, which in one embodiment may be portions of main memory locally attached to the respective processors.

Processors 570, 580 may each exchange information with a chipset 590 via individual P-P interfaces 552, 554 using point to point interface circuits 576, 594, 586, 598. In one embodiment, chipset 590 may also exchange information with a high-performance graphics circuit 538 via a high-performance graphics interface 539.

A shared cache (not shown) may be included in either processor or outside of both processors, yet connected with the processors via P-P interconnect, such that either or both processors' local cache information may be stored in the shared cache if a processor is placed into a low power mode.

Chipset 590 may be coupled to a first bus 516 via an interface 596. In one embodiment, first bus 516 may be a Peripheral Component Interconnect (PCI) bus, or a bus such as a PCI Express bus or another third generation I/O interconnect bus, although the scope of the present disclosure is not so limited.

As shown in FIG. 5, various I/O devices 514 may be coupled to first bus 516, along with a bus bridge 518 which couples first bus 516 to a second bus 520. In one embodiment, second bus 520 may be a Low Pin Count (LPC) bus. Various devices may be coupled to second bus 520 including, for example, a keyboard and/or mouse 522, communication devices 527 and a data storage unit 528 such as a disk drive or other mass storage device which may include instructions/code and data 530, in one embodiment. Further, an audio I/O 524 may be coupled to second bus 520. Note that other architectures may be possible. For example, instead of the point-to-point architecture of FIG. 5, a system may implement a multi-drop bus or other such architecture.

Figure 6:
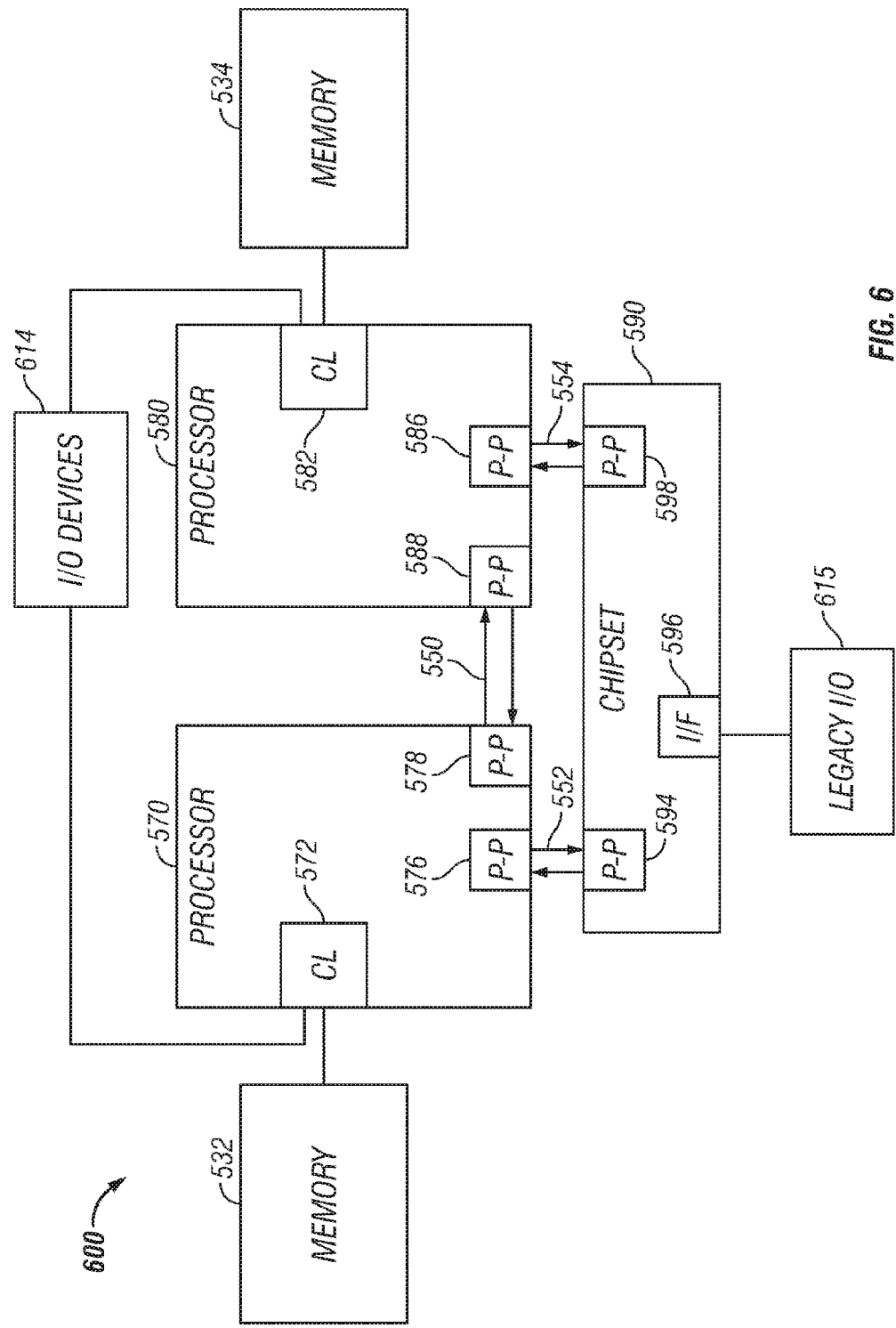
FIG. 6 is a block diagram of a third system, in accordance with embodiments of the present disclosure.

FIG. 6 illustrates a block diagram of a third system 600 in accordance with embodiments of the present disclosure. Like elements in FIGS. 5 and 6 bear like reference numerals, and certain aspects of FIG. 5 have been omitted from FIG. 6 in order to avoid obscuring other aspects of FIG. 6.

FIG. 6 illustrates that processors 570, 580 may include integrated memory and I/O Control Logic ("CL") 572 and 582, respectively. For at least one embodiment, CL 572, 582 may include integrated memory controller units such as that described above in connection with FIGS. 3-5. In addition. CL 572, 582 may also include I/O control logic. FIG. 6 illustrates that not only memories 532, 534 may be coupled to CL 572, 582, but also that I/O devices 614 may also be coupled to control logic 572, 582. Legacy I/O devices 615 may be coupled to chipset 590.

Figure 7:
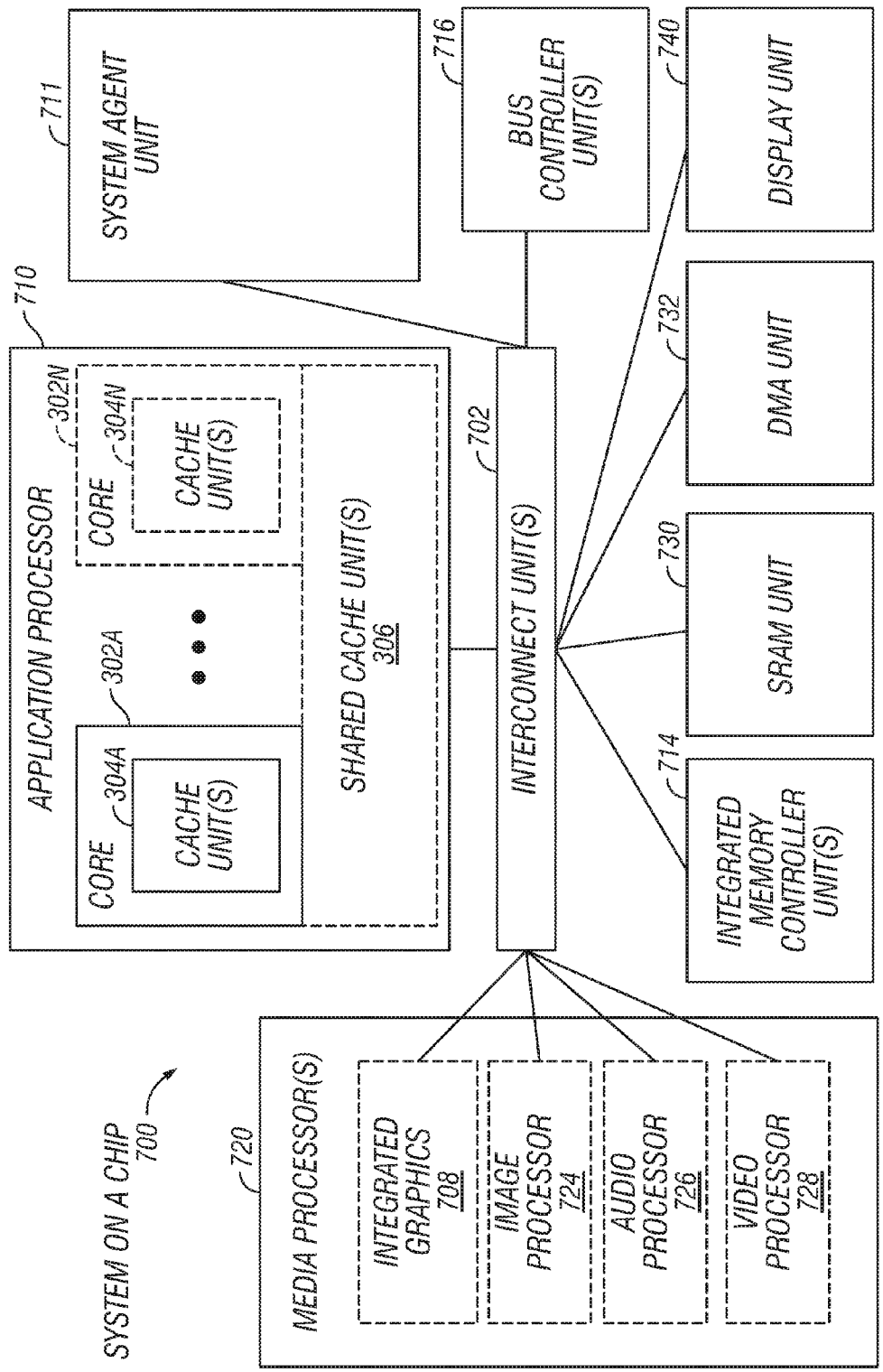
FIG. 7 is a block diagram of a system-on-a-chip, in accordance with embodiments of the present disclosure.

FIG. 7 illustrates a block diagram of a SoC 700, in accordance with embodiments of the present disclosure. Similar elements in FIG. 3 bear like reference numerals. Also, dashed lined boxes may represent optional features on more advanced SoCs. An interconnect units 702 may be coupled to: an application processor 710 which may include a set of one or more cores 302A-N, including respective local caches 504A-N, and shared cache unit or shared cache units 306; a system agent unit 711; a bus controller unit or bus controller units 716; an integrated memory controller unit 714; a set or one or more media processors 720 which may include integrated graphics logic 708, an image processor 724 for providing still and/or video camera functionality, an audio processor 726 for providing hardware audio acceleration, and a video processor 728 for providing video encode/decode acceleration; an SRAM unit 730; a DMA unit 732; and a display unit 740 for coupling to one or more external displays.

Figure 8:
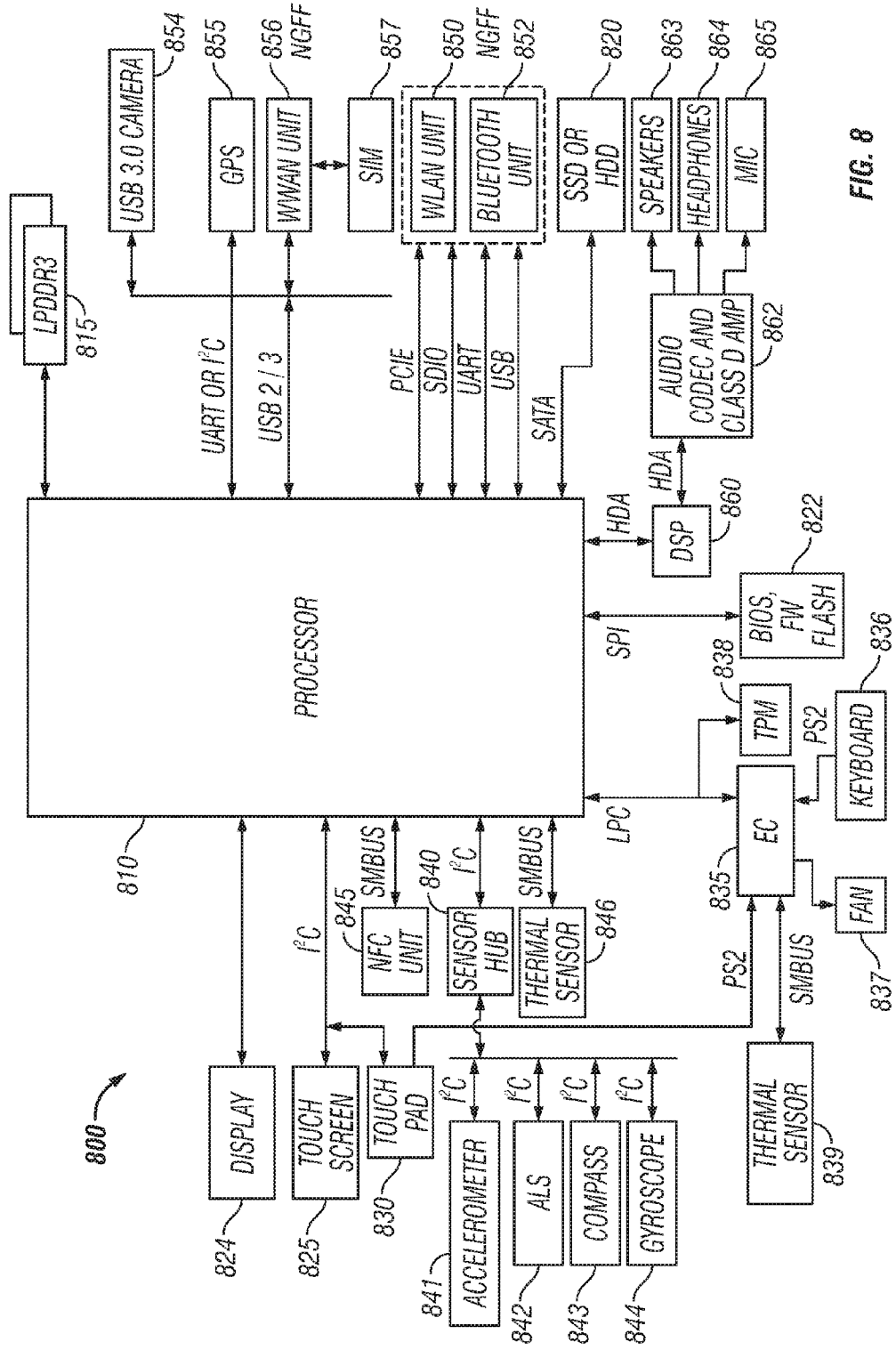
FIG. 8 is a block diagram of an electronic device for utilizing a processor, in accordance with embodiments of the present disclosure.

FIG. 8 is a block diagram of an electronic device 800 for utilizing a processor 810, in accordance with embodiments of the present disclosure. Electronic device 800 may include, for example, a notebook, an ultrabook, a computer, a tower server, a rack server, a blade server, a laptop, a desktop, a tablet, a mobile device, a phone, an embedded computer, or any other suitable electronic device.

Electronic device 800 may include processor 810 communicatively coupled to any suitable number or kind of components, peripherals, modules, or devices. Such coupling may be accomplished by any suitable kind of bus or interface, such as I²C bus, System Management Bus (SMBus), Low Pin Count (LPC) bus, SPI, High Definition Audio (HDA) bus, Serial Advance Technology Attachment (SATA) bus, USB bus (versions 1, 2, 3), or Universal Asynchronous Receiver/Transmitter (UART) bus.

Such components may include, for example, a display 824, a touch screen 825, a touch pad 830, a Near Field Communications (NFC) unit 845, a sensor hub 840, a thermal sensor 846, an Express Chipset (EC) 835, a Trusted Platform Module (TPM) 838, BIOS/firmware/flash memory 822, a DSP 860, a drive 820 such as a Solid State Disk (SSD) or a Hard Disk Drive (HDD), a wireless local area network (WLAN) unit 850, a Bluetooth unit 852, a Wireless Wide Area Network (WWAN) unit 856, a Global Positioning System (GPS) unit 855, a camera 854 such as a USB 3.0 camera, or a Low Power Double Data Rate (LPDDR) memory unit 815 implemented in, for example, the LPDDR3 standard. These components may each be implemented in any suitable manner.

Furthermore, in various embodiments other components may be communicatively coupled to processor 810 through the components discussed above. For example, an accelerometer 841, Ambient Light Sensor (ALS) 842, compass 843, and gyroscope 844 may be communicatively coupled to sensor hub 840. A thermal sensor 839, fan 837, keyboard 846, and touch pad 830 may be communicatively coupled to EC 835. Speaker 863, headphones 864, and a microphone 865 may be communicatively coupled to an audio unit 862, which may in turn be communicatively coupled to DSP 860. Audio unit 862 may include, for example, an audio codec and a class D amplifier. A SIM card 857 may be communicatively coupled to WWAN unit 856. Components such as WLAN unit 850 and Bluetooth unit 852, as well as WWAN unit 856 may be implemented in a Next Generation Form Factor (NGFF).

Figure 9:
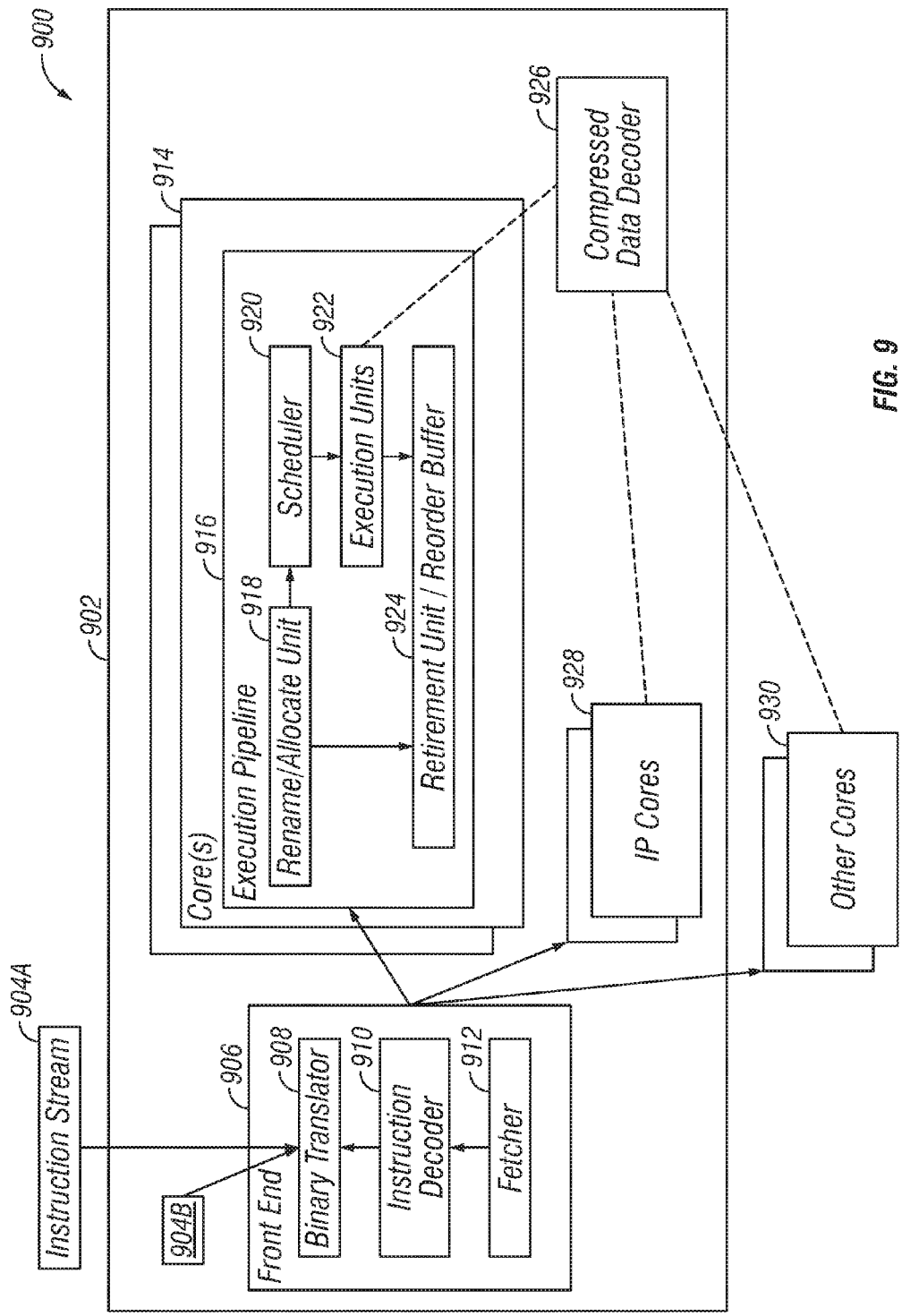
FIG. 9 is a block diagram of a system for compressed data decoding, in accordance with embodiments of the present disclosure.

FIG. 9 is an illustration of an example embodiment of a system 900 for compressed data decoding, according to embodiments of the present disclosure.

Lossless data compression may be used to reduce data storage and data transmission needs. This may be performed in, for example, media compression, transmitting or receiving HTTP traffic, database applications, storage systems, compressed file systems, or networking systems. Entropy encoding schemes, such as Huffman coding, may provide lossless compression with prefix codes representing data within stream. For example, repeated words in a sentence may be represented with prefix codes where the text is represented by a length and distance pair, corresponding to the distance in characters to look backward and the length or number of characters to repeat. These schemes may also utilize frequency-sorted binary trees to generate prefix codes of variable lengths. However, the present disclosure recognizes that decoding variable length prefix codes may require substantial resources, such as large amounts of storage, processing, or power, for particular low-power or high-throughput applications. System 900 may be preferable for use in such applications.

System 900 may utilize compressed data decoding in the process of performing any suitable task, including the lossless data compression uses listed above. System 900 may utilize compressed data decoding as part of executing instructions to fulfill these or other tasks. In one embodiment, system 900 may include a compressed data decoder 926.

Compressed data decoder 926 may utilize one or more logic units. These logic units may be used to traverse a tree structure using data from an encoded input data stream to access look-up tables with custom memory requirements. These requirements may result in implementations requiring serial processing of the input data stream. These requirements may render such logic units sub-optimal in, for example, direct use as compressed data decoders in high-volume, low-area processors. Overcoming non-idealities in serial processing by exhaustively storing codes for all possible inputs may require significant area on a die, such as a 128 KB memory structure. This might not be scalable to accommodate more restrictive area requirements without significant redesign. Accordingly, compressed data decoder 926 may be preferable for use in in ultra-low energy, internet-of-things (IoT), wearable, and ubiquitous sensing system platform applications.

Compressed data decoder 926 may be implemented by, for example, circuits, a combination of circuits and logic blocks, fully within hardware, or any other embodiments of the present disclosure. In one embodiment, compressed data decoder 926 may include a matching logic unit. In another embodiment, compressed data decoder 926 may include multiple matching logic units. In a further embodiment, compressed data decoder 926 may be a lightweight compressed data decoder, suitable for use on a SoC. Thus, compressed data decoder 926 may be suitable for seamless configuration across various throughput and energy budgets by modulating the number and location of matching logic units.

In one embodiment, compressed data decoder 926 may combine the functions of an accelerator and a data decoder to generate decoded data. In another embodiment, compressed data decoder 926 may use a lightweight matching logic unit to generate matching encoded values. In a further embodiment, compressed data decoder 926 may use an ALU in a processor to generate matching encoded values. In yet another, further embodiment, compressed data decoder 926 may use sorted tables of the data encountered in a compressed stream. In still another, further embodiment, compressed data decoder 926 may include one or more arrays. For example, compressed data decoder 926 may include an array with 15 entries for data encoded with the DEFLATE algorithm. The compressed data decoder 926 might be accomplished in approximately 2.7K gates.

In one embodiment, compressed data decoder 926 may be included in a processor, SoC, integrated circuit, or other mechanism. For example, system 900 may include processor 902. Although processor 902 is shown and described as an example, any suitable mechanism may be used. Processor 902 may include any suitable mechanisms for compressed data decoding. Processor 902 may be implemented fully or in part by the elements described in FIGS. 1-8. In another embodiment, compressed data decoder 926 may be co-located with a processor on a die, but may be a stand-alone entity. In still yet another embodiment, compressed data decoder 926 may be co-located with a process on a system, but may be a stand-alone entity.

Compressed data decoder 926 may be included in any suitable portion of processor 206. For example, compressed data decoder 926 may be implemented as an execution unit 922 within an in-order or out-of-order execution pipeline 916. In another example, compressed data decoder 926 may be implemented within an intellectual property (IP) core 928 separate from main cores of processor 902. In still yet another embodiment, compressed data decoder 926 may be implemented within other cores 930 separate from the processor 902.

Compressed data decoder 926 may be invoked in any suitable manner. Compressed data decoder 926 may be implicitly or explicitly invoked by instructions executing on system 900. Compressed data decoder 926 may be implicitly invoked by a core when, given a software instruction to read or to decode compressed data, the core may carry out the software instruction by accessing compressed data decoder 926. Compressed data decoder 926 may be explicitly invoked by a core when an instruction, created by a compiler, interpreter, or other entity with knowledge of the specific configuration of processor 902, identifies it to specifically handle decoding of compressed data. Compressed data decoder 926 may decode compressed data more efficiently that other execution units or IP cores that are to perform general arithmetic or mathematical operations.

Instructions may be received from instruction stream 904, which may be residing within a memory subsystem of system 900. The instruction steam 904 may be include in any suitable portion of processor 902 or system 900. In one embodiment, instruction stream 904A may be included in a SOC, system, or other mechanism. In another embodiment, instruction steam 904B may be included in a processor, integrated circuit, or other mechanism. Processor 902 may include a front end 906, which may receive and decode instructions from instruction stream 904 using a decode pipeline stage. The decoded instructions may be dispatched, allocated, and scheduled for execution by an allocate unit 918 and scheduler 920 of a pipeline 916 and allocated to specific execution units 922. After execution, instructions may be retired by a writeback stage or retirement stage in retirement unit 924. If processor 902 is out-of-order, allocate unit 918 may rename instructions and they may be input into a reorder buffer 924 in association with the retirement unit. The instructions may be retired as-if they were executed in-order.

Although various operations are described in this disclosure as performed by specific components of processor 902, the functionality may be performed by any suitable portion of processor 902.

Figure 10:
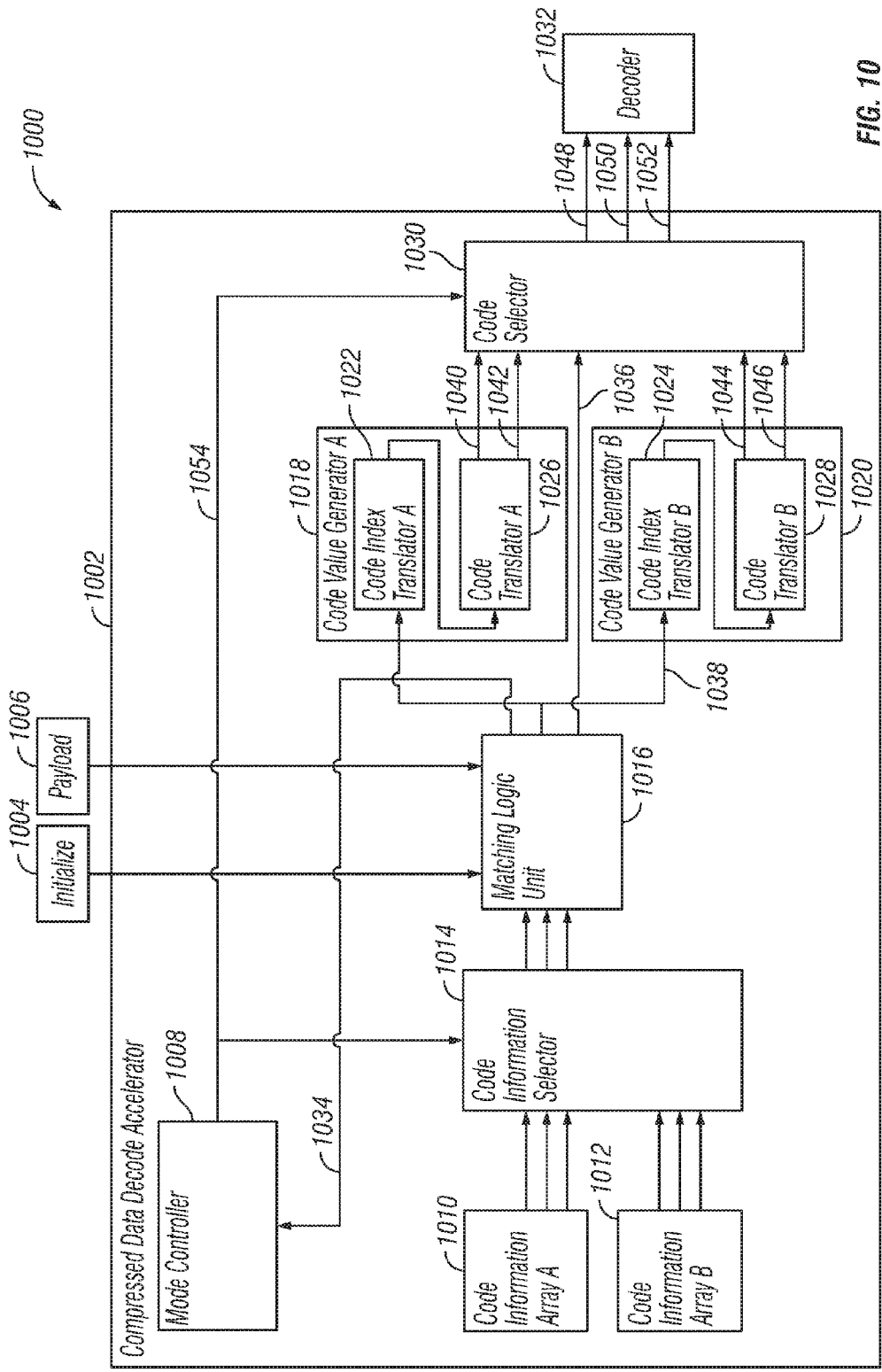
FIG. 10 is a block diagram of a compressed data decoder circuit, in accordance with embodiments of the present disclosure.

FIG. 10 is a block diagram of a compressed data decoder circuit 1000, in accordance with embodiments of the present disclosure. Compressed data decoder circuit 1000 may be implemented, fully or in part, in compressed data decoder 926. Compressed data decoder circuit 1000 may include a compressed data decode accelerator 1002 and a data decoder 1032.

Compressed data decoder circuit 1000 may include any suitable number of code information arrays corresponding to the type of compression applied to the compressed data. In one embodiment, compressed data decoder may include code information arrays 1010 and 1012. Each such code information array may be sized in linear relation to the maximum number of bits for a code. Example embodiments of these code information arrays are discussed in more detail below.

In one embodiment, code information arrays 1010 and 1012 may provide information to a code information selector 1014. The code information selector may use an output from a mode controller 1008 to select between the different inputs from the code information arrays 1010 and 1012. In another embodiment (not shown), the mode controller 1008 may provide a selected mode to a matching logic unit 1016. The matching logic unit 1016 may then select between the code information arrays.

In one embodiment, matching logic unit 1016 receives an initialize input 1004 and a payload input 1006. The matching logic unit may also initialize operation to process a payload. The matching logic unit may output a signal 1034 to the mode controller 1008 indicating whether or not a match has occurred, a matching code length 1036 to the code selector 1030, and a matching code index 1038 to a code value generator. In one embodiment, compressed data decode accelerator 1002 may be customized to the needs of the decoder. In another embodiment, compressed data decode accelerator 1002 may use an ALU to complete the necessary operations.

Compressed data decoder circuit 1000 may include any suitable number of code value generators corresponding to the type of compression applied to the compressed data. In one embodiment, the code value generators 1018 and 1020 may generate values for different types of codes respectively. In another embodiment (not shown), the code value generator may generate values for a particular type of code, specified by the mode controller 1008. The code index translators 1022 and 1024 may translate the matching code index 1038 into matching codes. The code translators 1026 and 1028 may translate the matching codes into code types 1040 and 1044 and code values 1042 and 1046. In one embodiment, the code index translators 1022 and 1024 may have corresponding codes sorted. In another embodiment, the code index translators 1022 and 1024 may have corresponding codes unsorted and may search for a match. The code value generators may provide outputs to the code selector 1030.

In one embodiment, the code selector 1030 may reside within the compressed data decode accelerator 1002. In another embodiment, the code selector 1030 may reside within the data decoder 1032. In still yet another embodiment, the code selector 1030 may reside within the code value generators 1018 and 1020. The code selector 1030 may receive the selected mode 1054 from the mode controller 1008, the code types 1040 and 1044 from the code value generators 1018 and 1020, the code values 1042 and 1046 from the code value generators 1018 and 1020, and the code length from matching logic unit 1016. In one embodiment, the code value may consist of a base value and an extra-bits value. In another embodiment, the code value may consist of a literal value.

The code selector 1030 may determine the proper number of bits consumed. In one embodiment, the number of bits consumed may be equal to the code length. In another embodiment, the number of bits consumed may be computed by adding together the matching code length 1036 and the extra bits required by the matching code. The data decoder 1032 may receive the number of bits consumed 1052 from the code selector 1030 and may use it to determine how far to advance the payload for further processing.

In one embodiment, the code selector 1030 may use an encoded code value received from the code value generators 1018 and 1020 to compute the actual code values. The code selector 1030 may support multiple types of codes and modes of operation to satisfy all the needs of the data decoder 1032.

In one embodiment, the data decoder 1032 may receive the selected code type 1048, selected code value 1050, and the number of bits consumed 1052 from the code selector 1030. The data decoder may use these inputs to decompress the compressed data. The data decoder may support any suitable type of compression. In one embodiment, the data decoder may support Huffman encoding with length and distance pairs embedded with literal uncompressed data. Literal uncompressed data, the maximum length code, and the end of block code may consume a number of bits equivalent to the code length.

Mode controller 1008, code information selector 1014, code value generators 1018 and 1020, and code selector 1030 may be implemented, fully or in part, by matching logic unit 1016.

Figure 11:
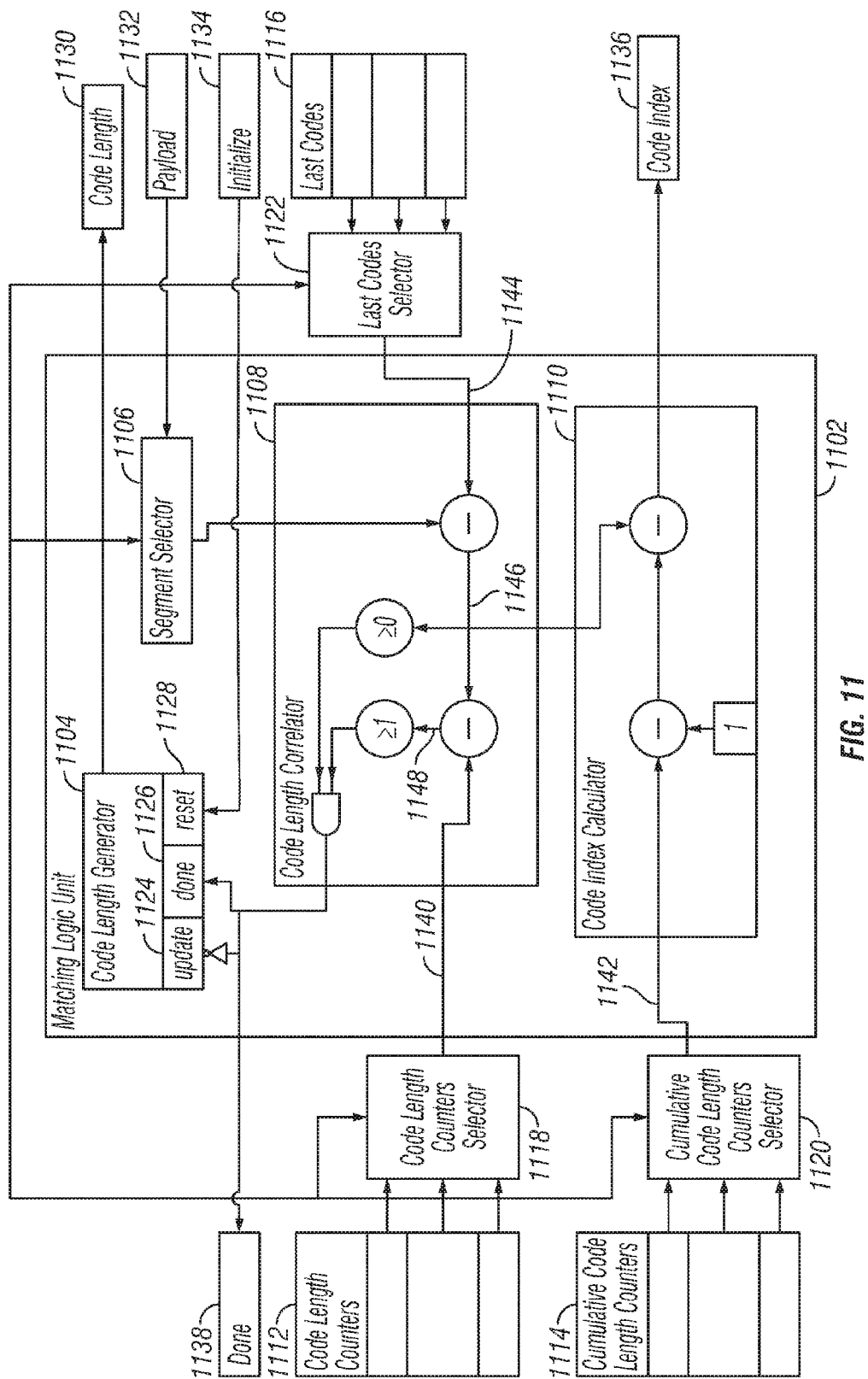
FIG. 11 is a block diagram of a matching logic unit for a compressed data decoder circuit, in accordance with embodiments of the present disclosure.

FIG. 11 is a block diagram of matching logic unit 1102 for a compressed data decoder circuit, in accordance with embodiments of the present disclosure. Matching logic unit 1102 may implement, fully or in part, compressed data decoder 926.

In one embodiment, matching logic unit 1102 may be implemented with an ALU in a processor. In another embodiment, matching logic unit 1102 may be implemented with a code length generator 1104, a segment selector 1106, a code length correlator 1108, and a code index generator 1110. The code length generator 1104 may receive an update signal 1124 and a done signal 1126 from the code length correlator 1108, and a reset signal 1128 from the initialize input 1134. The code length generator may generate a code length 1130, which may be used by the segment selector 1106 to generate a segment of a payload 1132 where the length of the segment may be equivalent to the code length. The size of the segment may be less than or equal to the size of the payload 1132.

In one embodiment, matching logic unit 1102 may receive a code length count 1140 and a last code 1144. Both the code length count 1140 and the last code 1144 might be selected by the code length 1130 from the code length counters 1112 and last codes 1116 using the code length counters selector 1118 and last codes selector 1122. The code length counters 1112 may contain a counter for each code length corresponding to the number of times a code length has appeared. The last codes 1116 may contain the last code that can appear for each code length. In one embodiment, last code 1144 corresponds to the theoretical maximum value of a code for a given code length. In another embodiment, last code 1144 corresponds to the actual maximum value of a code for a given code length.

In another embodiment, matching logic unit 1102 may receive a code length count 1140, a last code 1144, and a cumulative code length count 1142. The code length counters 1112 may contain a count for each code length corresponding to the number of times a code length has appeared. The cumulative code length counters 114 may contain a count for each code length corresponding to the number of times a code length of the same or smaller length has appeared. The last codes 1116 may contain the last code that can appear for each code length. In one embodiment, last code 1144 corresponds to the theoretical maximum value of a code for a given code length. In another embodiment, last code 1144 corresponds to the actual maximum value of a code for a given code length. The code length count 1140, cumulative code length count 1142, and last code 1144 might be selected by the code length 1130 from the code length counters 1112, cumulative code length counters 1114, and last codes 1116 using a code length counters selector 1118, a cumulative code length counters selector 1120, and a last codes selector 1122. Code length counters 1112, cumulative code length counters 1114, or last codes 1116, individually or as a whole, may implement code information arrays 1010 and 1012.

In one embodiment, a code length correlator 1108 may compute a last code difference 1146 and a code length count difference 1148. The last code difference 1146 may be the difference between the last code 1144 from the last codes selector 1122 and a segment from the segment selector 1106. The code length count difference 1148 may be the difference between the code length count 1140 from the code length counters selector 1118 and the last code difference 1146. Code length correlator 1108 might find a match when the last code difference 1146 is greater than or equal to zero and the code length count difference 1148 is greater than or equal to one. In the event that the code length correlator finds a match, a done signal 1138 may be output, indicating that a match has occurred. In a further embodiment, the done signal 1138 may inform the code length generator 1104 not to update to the next code length, but rather to setup for the next payload.

In further embodiment, a code index 1136 may be computed by calculating subtracting one from the cumulative code length count 1142 and subtracting the last code difference 1146 from that result. In still yet another embodiment (not shown), a code index 1136 may represent the segment of bits from the segment selector 1106. The size of the segment may be less than or equal to the size of the payload 1132.

Code length counters selector 1118, cumulative code length counters selector 1120, and last codes selector 1122 may be implemented, fully or in part, by matching logic unit 1102. Code length correlator 1108 may be implemented, fully or in part, by code length generator 1104. Code index generator 1110 may implemented, fully or in part, by code length correlator 1108. Segment selector 1106 may be implemented, fully or in part, by code length correlator 1108.

Figure 12:
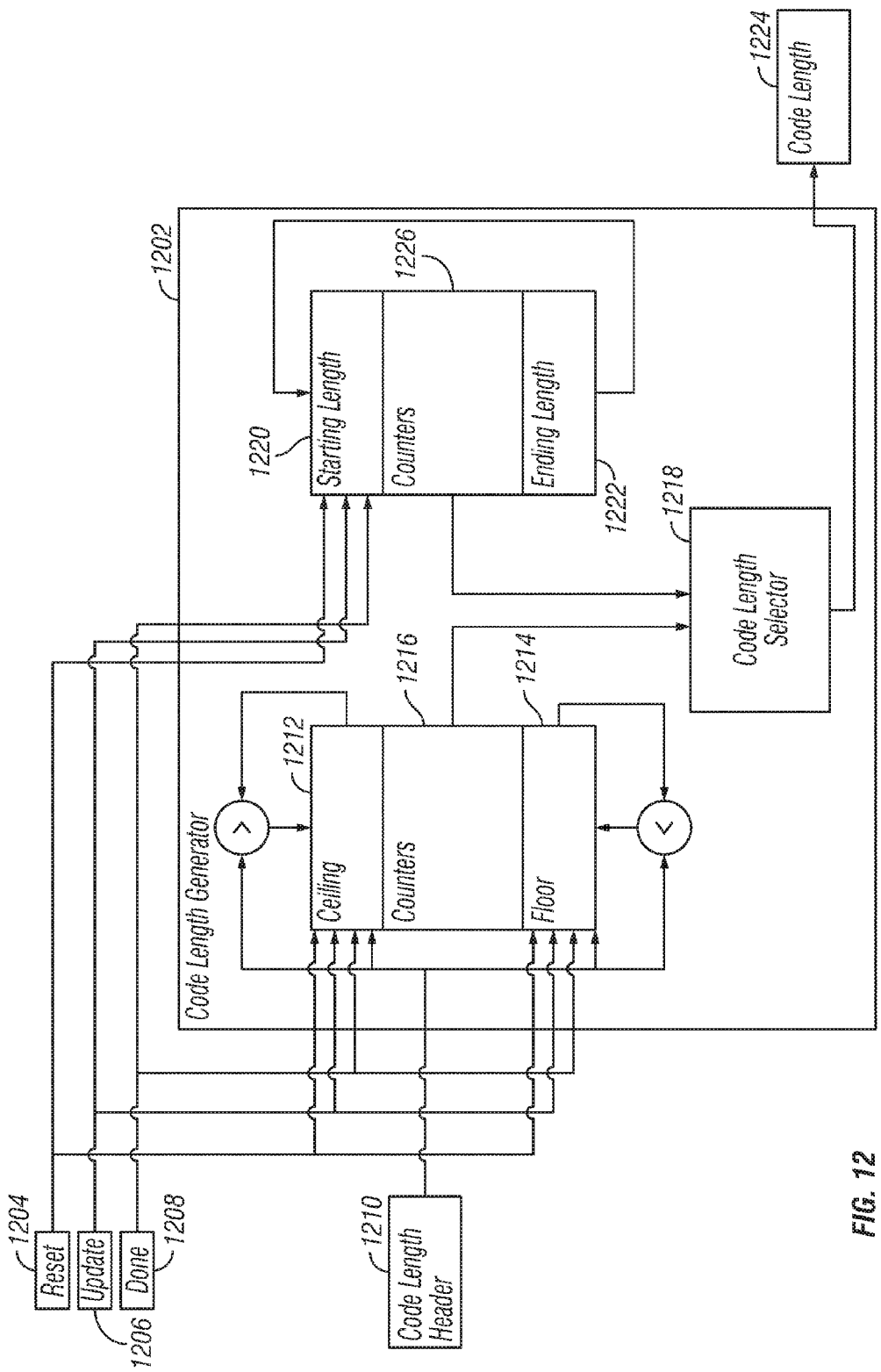
FIG. 12 is a block diagram of a code length generator unit, in accordance with embodiments of the present disclosure.

FIG. 12 is a block diagram of a code length generator 1202, in accordance with embodiments of the present disclosure. Code length generator 1202 may provide, fully or in-part, one or more code lengths 1130 to enable matching logic unit 1102 to evaluate any arbitrary code length.

In one embodiment, the code length 1224 may be selected by the code length selector 1218 to be a value between a starting length 1220 and a ending length 1222. The starting length 1220 may be the smallest possible code length for a given compression scheme and the ending length 1222 may be the largest possible code length for a given compression scheme.

In another embodiment, the code length 1224 may be selected by the code length selector 1218 to be a value between a starting length 1220 and a ending length 1222 that adapt to the codes in decreasing order of code probability.

In a further embodiment, the code length 1224 may be opportunistically selected by the code length selector 1218 to be a value between a ceiling register 1212 and a floor register 1214. The ceiling register 1212 may represent the largest actual code length used in a block of compressed data, as specified in the code length header 1210. The floor register 1214 may represent the smallest actual code length used in a block of compressed data, as specified in the code length header 1210.

In still yet another embodiment, the code length 1224 may represent a subset of values between a ceiling register 1212 and a floor register 1214, where each value in the subset are non-zero, indicating the code length actually exists in a block of compressed data. For example, code lengths 1 through 3, 7 through 10, and greater than 13 might not actually exist in a block of compressed data. The ceiling register may be set to 6 and the floor register may be set to 3 to limit the matching code length range between 3 and 6 bits. In another embodiment, the ceiling register may be set to 12 and the floor register may be set to 3, while the counters may skip code lengths 1 through 3, 7 through 10, and greater than 13 due to the absence of actual matching codes in a block of compressed data. In a further embodiment, compressed data decode accelerator 1002 may include any suitable number of code length generators 1202 or counters 1216 and 1226 to process each range of valid code lengths in a block of compressed data. For example, compressed data decode accelerator 1002 may include self-converging code length generators or counters with one to increase the code length to find a matching code length and the other to decrease the code length to find a matching code length.

In one embodiment, the ceiling register 1212, floor register 1214, starting length 1220, and ending length 1222 may be set according to the reset 1204, update 1206, and done 1208 inputs to the code length generator 1202. The reset input 1204 may set the code length generator 1202 in anticipation of processing a block of compressed data with unique compression codes by clearing the ceiling register 1212, the floor register 1214, the starting length 1220, the ending length 1222, and counters 1216 and 1226. The update input 1206 may set the code length generator 1202 during the processing of a block of compressed data, indicating that a match with code length 1224 has not been found by the code length correlator 1108 and enabling the counters 1216 and 1226 to update. The done input 1208 may set the code length generator 1202 during the processing of a block of compressed data, indicating that a match with code length 1224 has been found by the code length correlator 1108 and enabling the counters 1216 and 1226 to reset.

Figure 13:
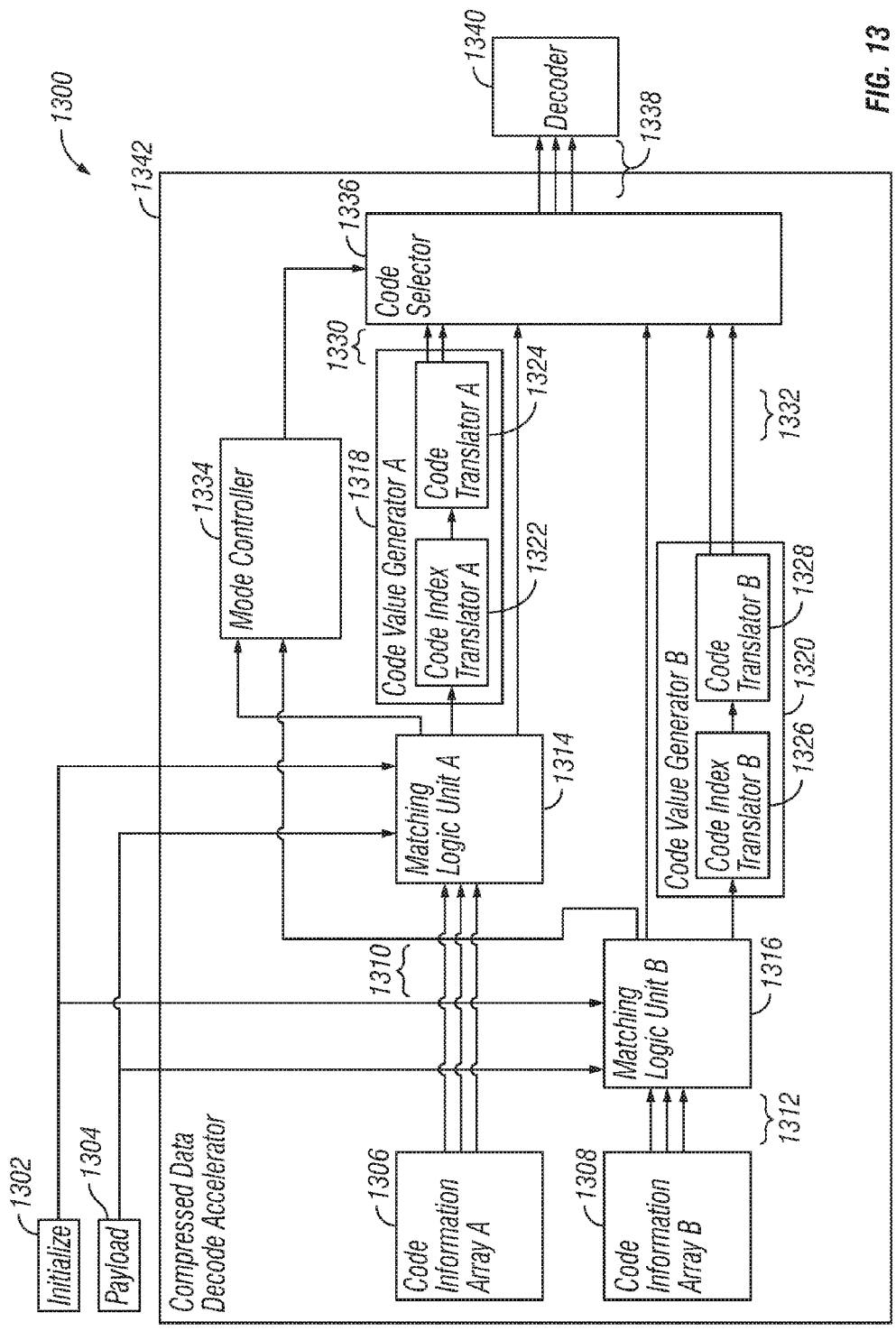
FIG. 13 is a block diagram of a compressed data decode accelerator with multiple matching logic units, in accordance with embodiments of the present disclosure.

FIG. 13 is a block diagram of a compressed data decode accelerator 1342 with two matching logic units 1314 and 1316, in accordance with embodiments of the present disclosure. Compressed data decode accelerator 1342 and decoder 1340 may implement, fully or in part, compressed data decoder 1300.

Compressed data decode accelerator 1342 may include any suitable number of code information arrays as required by a particular type of compression. For example, the DEFLATE algorithm requires both literal and distance codes. In one embodiment, compressed data decode accelerator 1342 may include code information array A 1306 and code information array B 1308. Code information array A may be sized differently than code information array B.

In one embodiment code information arrays 1306 and 1308 may provide bundles of information 1310 and 1312, each consisting of code length counters 1112 and last codes 1116. In a further embodiment, code information arrays 1306 and 1308 may provide bundles of information 1310 and 1312, each consisting of code length counters 1112, last codes 1116, and cumulative code length counters 1114.

In one embodiment, matching logic unit 1314 may accept bundle of information 1310 from code information array 1306 and matching logic unit 1316 may accept bundle of information 1312 from code information array 1308. Matching logic units 1314 and 1316 may each provide mode controller 1334 with an indication of a matching code length.

Code value generators 1318 and 1320 may include code index translators 1322 and 1326 respectively, and discrete code translators 1324 and 1328 respectively. In one embodiment, code index translators 1322 and 1326 may translate a code index into a code using a sorted table. In another embodiment (not shown), code index translators 1322 and 1326 may find the corresponding code for a specified code and code length from matching logic units 1314 and 1316.

Code selector 1336 may switch between code types to handle input from code value generators 1318 and 1320. Code selector 1336 may implement, fully or in part, code selector 1030. Moreover, decoder 1340 may implement, fully or in part, decoder 1032. Furthermore, signals 1330 and 1332 may represent code types 1040 and 1044 and code values 1042 and 1046. The compressed data decoder 1300 may support any suitable type of compression. For example, the data decoder may support Huffman encoding with length and distance pairs embedded with literal uncompressed data. In one embodiment, a compressed data decoder 1300 with two matching logic units may provide a latency of 6 cycles per symbol. In another embodiment (not shown), a compressed data decoder may have two matching logic units for each type of code and may provide a latency of 3 cycles per symbol. For example, a decoder supporting the DEFLATE algorithm may have a total of four matching logic units. The two matching logic units may be self-converging on a matching code. The self-converging decoder may have multiple matching logic units converging on a matching code length. For example, one matching logic unit may increase in code length to find a matching code length and another matching logic unit may decrease in code length to find a matching code length. In a further embodiment (not shown), a compressed data decoder may have four matching logic units for each type of code. The matching logic units may be self-converging on a matching code and separate sets of matching logic units may be assigned to a subset of the possible code lengths via the code length generator 1202 as described above.

Mode controller 1334, code value generators 1318 and 1320, and code selector 1336 may be implemented, fully or in part, by matching logic units 1314 and 1316.

Figure 14:
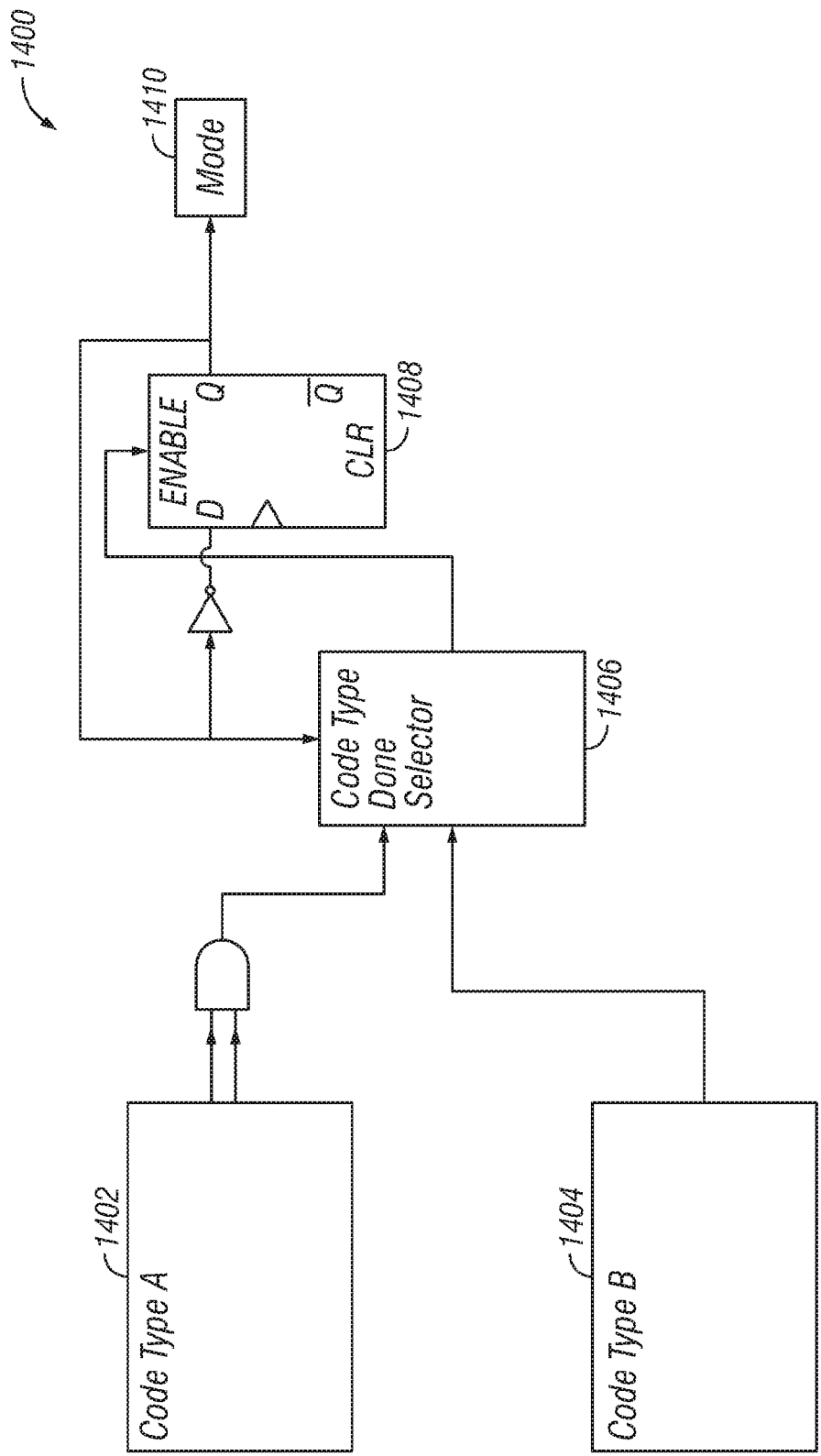
FIG. 14 is a block diagram of a mode generator unit, in accordance with embodiments of the present disclosure.

FIG. 14 is a block diagram of a mode generator unit 1400, in accordance with embodiments of the present disclosure. Mode controller 1400 may implement, fully or in part, mode controller 1334.

In one embodiment, the mode 1410 might be output from a flip-flop or latch 1408, which may be enabled by the output of a code type done selector 1406. The code type done selector 1406 may switch between code type A's done signal 1402 and code type B's done signal 1404 using the previous mode 1410 that was output by the latch 1408. The mode controller 1400 may also latch and logically AND together the done signals for code types that support more than one code. For example, the DEFLATE algorithm requires shared encoding between literal and length codes where the code type done signal would not be set unless a length code were previously decoded. The mode controller 1400 may be implemented in any suitable manner to satisfy the requirements of any encoding scheme.

Code type done selector 1406 may be implemented, fully or in part, by latch 1408.

Figure 15:
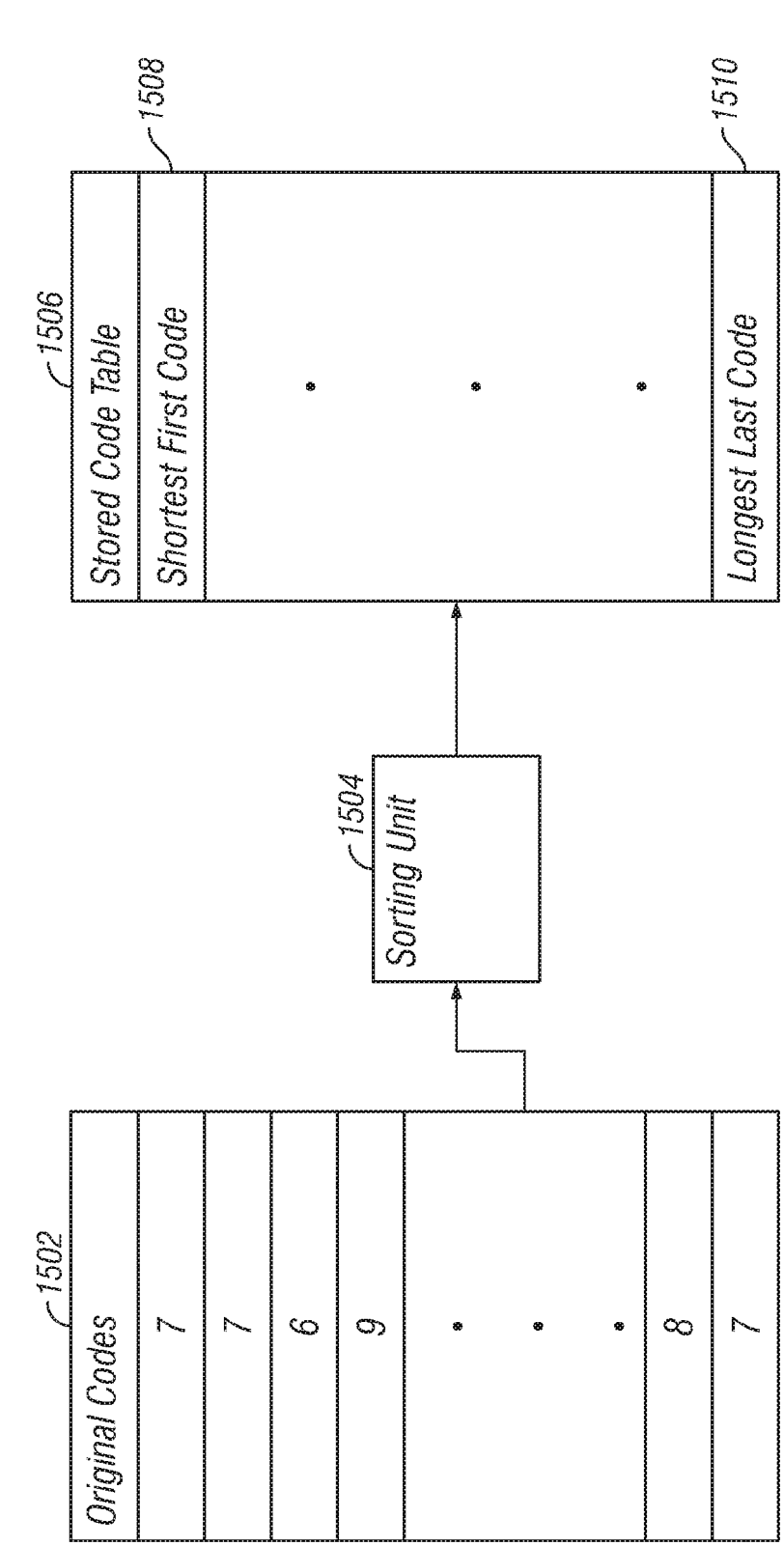
FIG. 15 is a block diagram of a code index translator, in accordance with embodiments of the present disclosure.

FIG. 15 is a block diagram of a code index translator 1500, in accordance with embodiments of the present disclosure. The code index translator 1500 may be implemented using a stored code table 1506. In one embodiment, the stored code table 1506 may be generated by the sorting unit 1504 using the original codes 1502 from a block of compressed data. The sorting unit 1504 may be implemented using any processor that can sort the unsorted codes in any order. For example, the codes could start with the first occurrence of the shortest code and end with the last occurrence of the longest code. In another embodiment (not shown), the stored code table 1506 may be generated with codes in any order without the sorting unit 1504 using the original codes 1502 from a block of compressed data.

Figure 16:
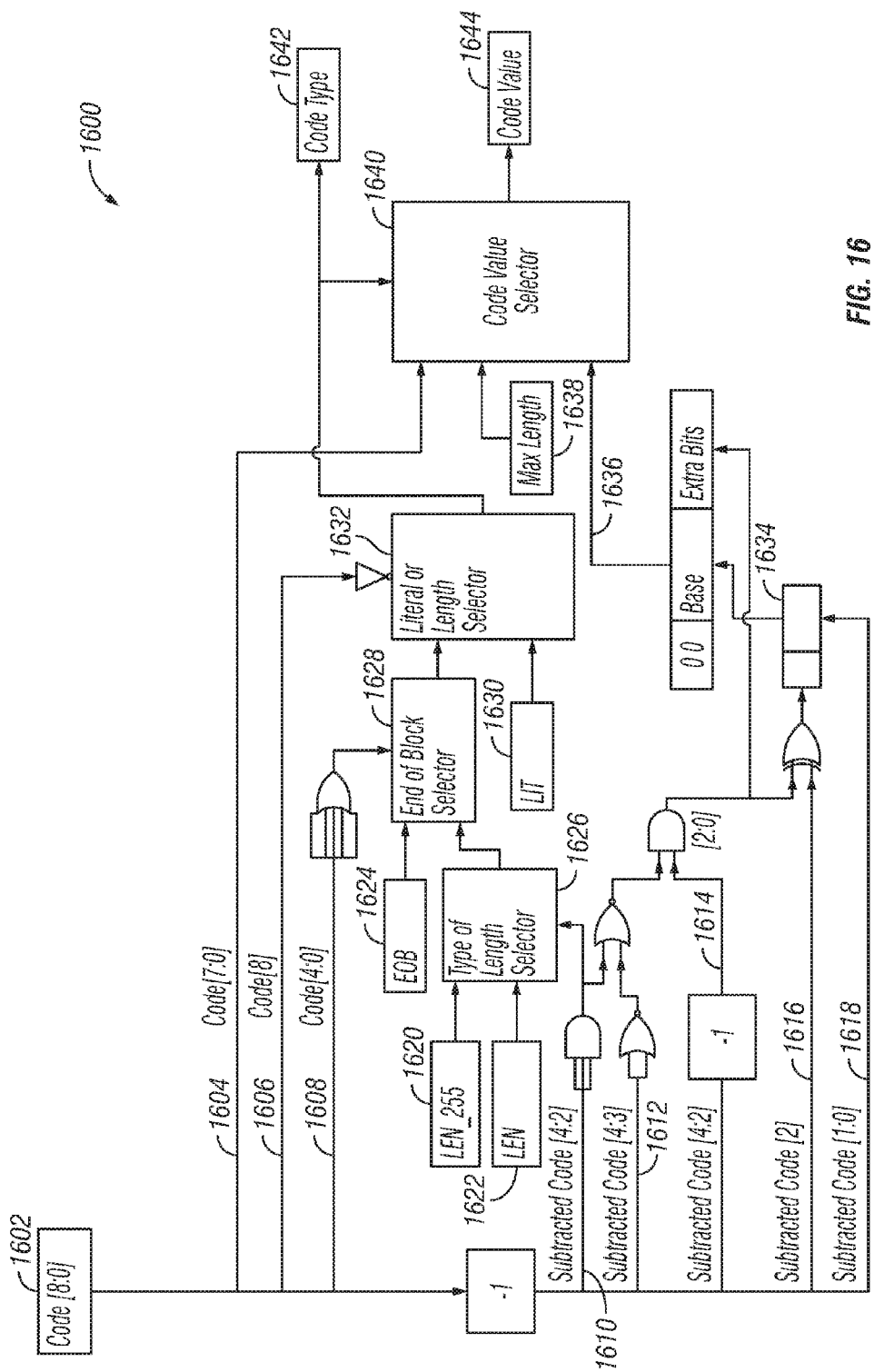
FIG. 16 is a block diagram of a literal and length code translator, in accordance with embodiments of the present disclosure.

FIG. 16 is a block diagram of a literal and length code translator 1600, in accordance with the embodiments of the present disclosure. Code translators 1026 and 1028 may be implemented, fully or in part, by literal and length code index translator 1600. Code translator 1600 may represent a fixed-function process for simple translation.

In one embodiment, the literal and length code index translator 1600 may translate a 9-bit code 1602 into a code type 1642 and a code value 1644. The subtracted code may represent the lower five bits of the 9-bit code 1602, minus one. The code type output 1640 may represent a selection based on the code input 1602. The upper three bits of the subtracted code 1610 may be logically combined via an AND gate to select between LEN_255 1620, a code type associated with the maximum possible length value, and LEN 1622, a code type associated with all the other possible lengths, using the type of length selector 1626. The lower five bits 1608 of the code 1602 may be logically combined via an OR gate to select between the output of the type of length selector 1626 and EOB 1624, a code type associated with the end of block code. Moreover, the most significant bit 1606 of the 9-bit code 1602 may be logically inverted to select between LIT 1630, a code type associated with literal values, and the output of the end of block selector 1628, using the literal or length selector 1632.

The literal and length code index translator 1600 may generate an 8-bit code value 1644 from the code value selector 1640. The code value selector 1640 may use the code type 1642 to select an input for output to the code value 1644. A max length 1638 may correspond to the maximum length for an algorithm. For example, the maximum length would be 255 for the DEFLATE algorithm. A code type of LIT 1630 may correspond to a literal value, derived from the code value selector 1640 selecting the lower eight bits 1604 of the code for the code value 1644. A code type of EOB 1624 may result in a don't care value for the code value 1644. A code type of LEN 1622 may select the encoded base and extra bits value 1636 that may be computed by the literal and length code index translator 1600.

The encoded value 1636 may be an 8-bit value comprised of a 3-bit base value 1634 and a 3-bit extra-bits value. The base value 1634 may consist of the least significant two bits of the subtracted code 1618 logically combined via an XOR gate of the third least significant bit of the subtracted code 1616 with the three-bit result of a circuit. The three bit result, which may be derived from portions of the subtracted code 1610, 1612, and 1614, may also determine the number of extra-bits value. A decoder 1032 may need to further process the code value 1644 to determine a length. For example, a decoder might need to discard the number of bits corresponding to the code length, use the number of extra-bits value in the code value 1644 to determine the number of extra bits to read, read the extra bits, and append the 3-bit base value 1634 to the extra-bits read.

FIG. 17 is a table summarizing the length code translation 1702, in accordance with the embodiments of the present disclosure. The length code translation 1702 may represent the literal and length index translator 1600, fully or in part. The code value may represent the input code subtracted by one. A decoder 1032 may need adjust the calculated length value by three to arrive at the correct decoded length.

Figure 18:
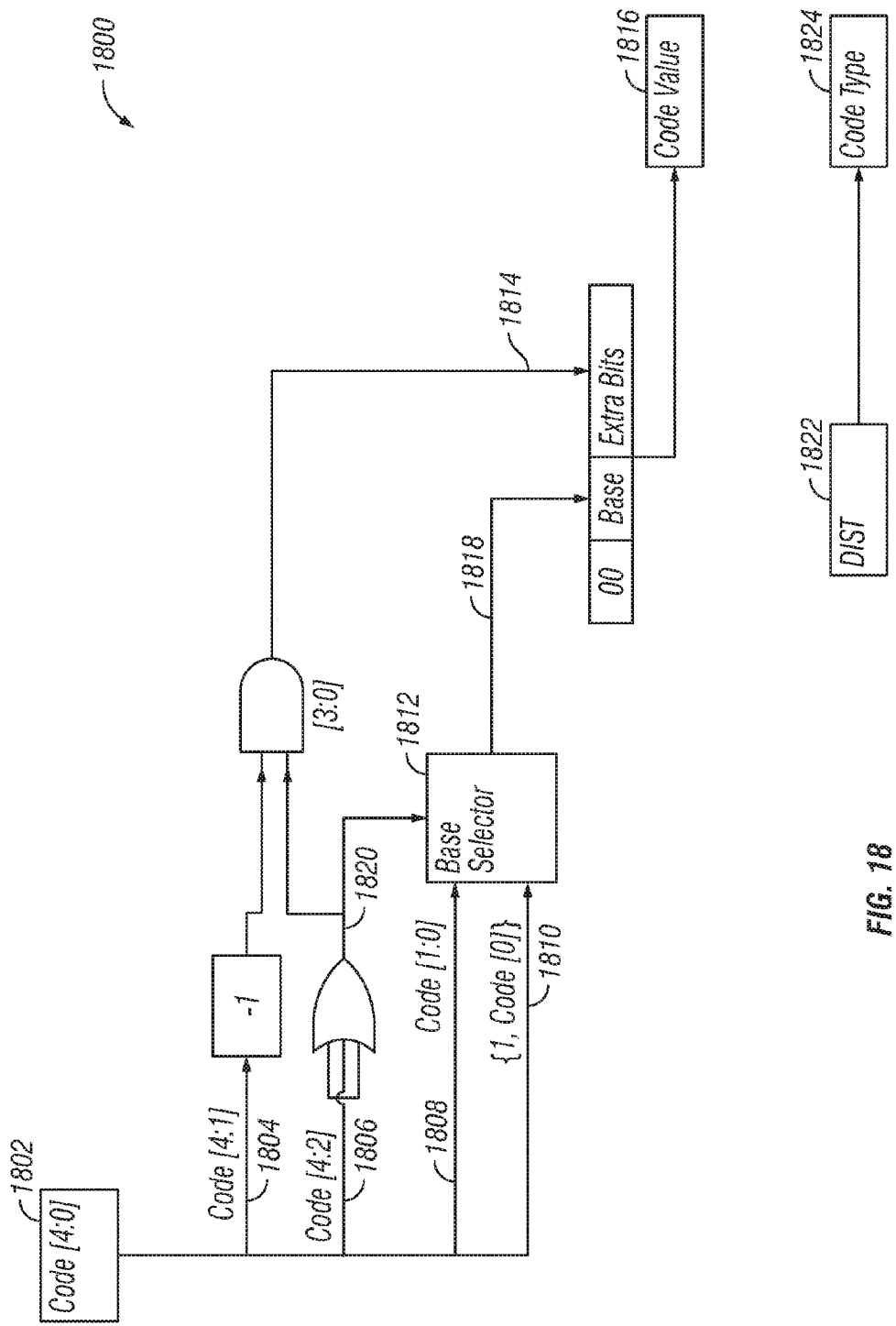
FIG. 18 is a block diagram of a distance code translator, in accordance with embodiments of the present disclosure.

FIG. 18 is a block diagram of a distance code translator 1800, in accordance with the embodiments of the present disclosure. Code translators 1026 and 1028 may be implemented, fully or in part, by distance index translator 1800.

In one embodiment, distance code translator 1800 may generate a code value 1816 from a five-bit code input 1802. The code input 1802 may be parsed for the four most significant bits and subtracted by one to generate an extra-bits value 1814, also consisting of four bits. The three most significant bits of the code input 1806 may be logically combined via an OR gate to generate a selector value 1820. A selector value of zero may result in an extra-bits 1814 value of zero. A 2-bit base value 1818 may be generated from either the two least significant bits of the code input 1808 or the least significant bit of the code input 1810. The base selector 1812 might choose the either input 1808 or 1810 depending on the selector value 1820. The code type output 1824 may be fixed to a distance code type 1822. A decoder 1032 may need to further process the code value 1816 to determine a distance. For example, a decoder might need to discard the number of bits corresponding to the code length, use the number of extra-bits value 1814 to determine the number of extra bits to read, read the extra bits, and append the 2-bit base value 1818 to the extra-bits read.

FIG. 19 is a table summarizing distance code translation 1902, in accordance with the embodiments of the present disclosure. The distance code translation 1902 may represent the distance index translator 1800, fully or in part. A decoder 1032 may need to adjust the calculated distance value by one to arrive at the correct decoded distance.

Figure 20:
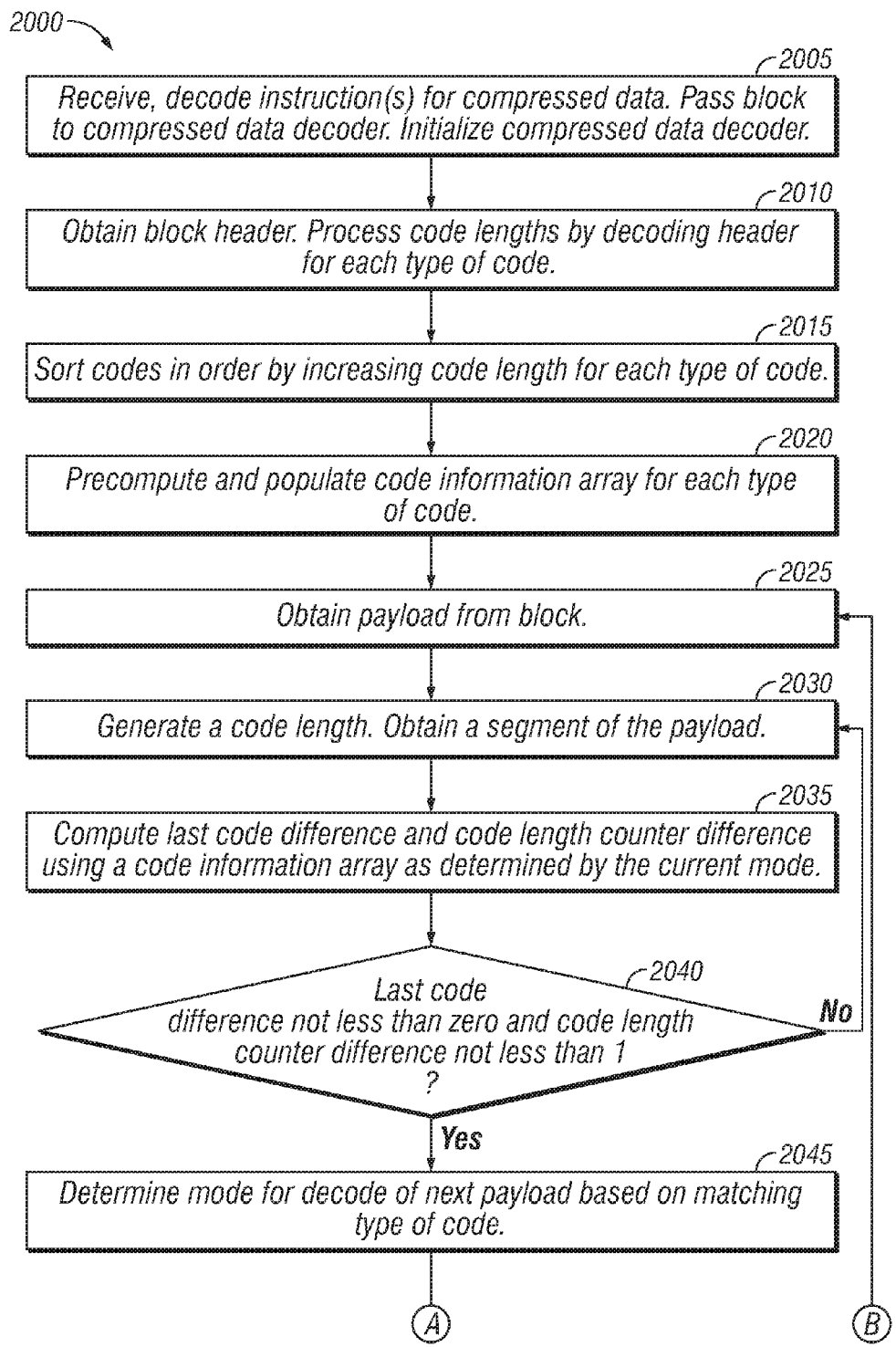
FIG. 20 is a block diagram of a method for compressed data decoding, in accordance with embodiments of the present disclosure.
Figure 20:
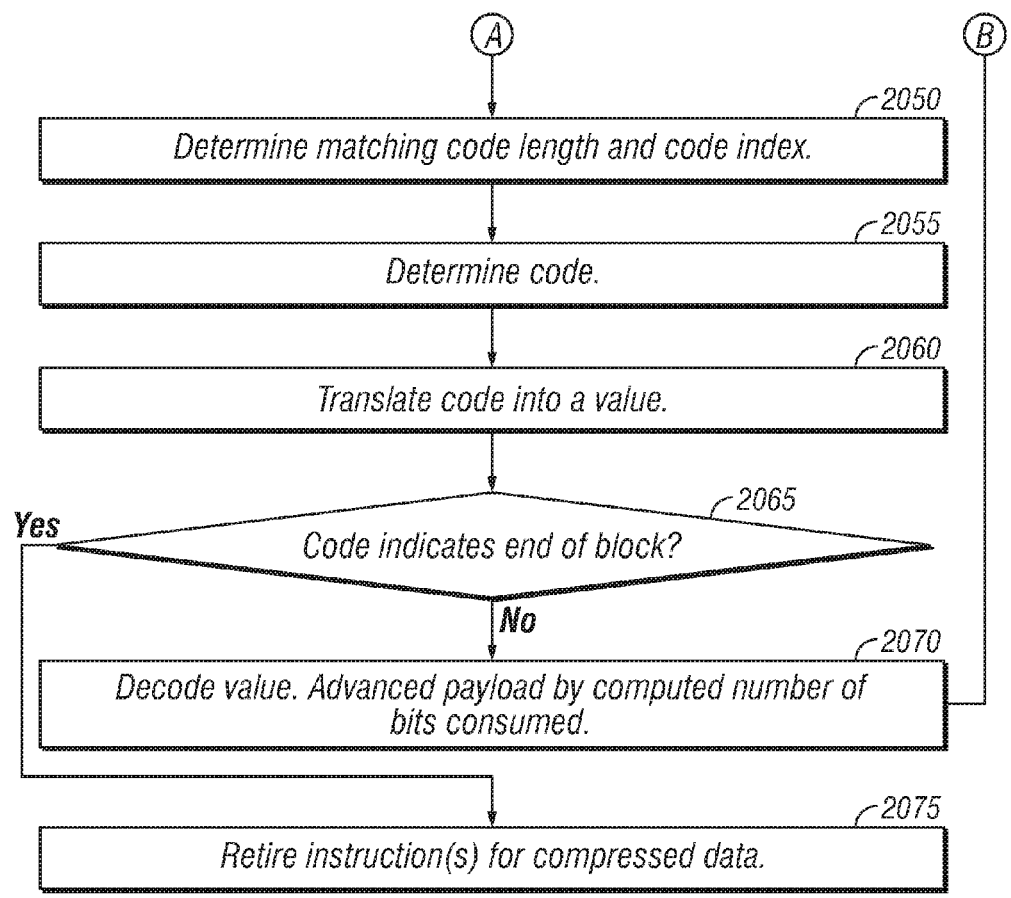

FIG. 20 is a block diagram of a method 2000 for compressed data decoding, in accordance with embodiments of the present disclosure. Method 2000 may be implemented by any of the elements shown in FIGS. 1-19. Method 2000 may be initiated by any suitable criteria and may initiate operation at any suitable point. In one embodiment, method 2000 may initiate operation at 2005. Method 2000 may include greater or fewer steps than those illustrated. Moreover, method 2000 may execute its steps in an order different than those illustrated below. Method 2000 may terminate at any suitable step. Moreover, method 2000 may repeat operation at any suitable step. Portions of method 2000 may be performed in parallel and repeat with respect to other portions of method 2000.

At 2005, in one embodiment the compressed data decoder may receive a block of compressed data after one or more instructions are received and decoded for compressed data decoding. In another embodiment, the compressed data decoder may receive a block of compressed data without decoding an instruction for compressed data decoding. The compressed data decoder may also be initialized to begin decoding. The initialization process may include initializing a matching logic unit within the compressed data decode accelerator and initializing a mode generator to generate an initial current mode. In one embodiment, the initial current mode may be set to decode a code for literal values. In another embodiment, the initial current mode may be set to decode a code for length or distance values in reference to data within a previous block of compressed data.

At 2010, the block header for the block of compressed data may be obtained. The block header may be decoded for each type of code.

At 2015, in one embodiment, the codes in the block of compressed data may be sorted by increasing code length for each type of code. In another embodiment, the codes may remain unsorted. In one embodiment, the sorting may be performed by the compressed data decoder. In another embodiment, the sorting may be performed by a processor.

At 2020, the code information array for each type of code may be pre-computed and populated. In one embodiment, the pre-computing and population occurs within the compressed data decoder. In another embodiment, the pre-computing and population may be performed by a processor. In one embodiment, the pre-computing and population may include parsing the number of occurrences of each code length and the last code encountered for each code length. In another embodiment, the pre-computing and population may include parsing the number of occurrences of each code length, the number of occurrences of codes less than or equal to in code length to each code length, and the last code encountered for each code length. The number of code lengths may be linearly proportional to the maximum number of bits representing codes for a particular compression algorithm applied to the compressed data.

At 2025, a payload may be obtained from the block of compressed data.

The size of the payload may be proportional to the maximum number of bits representing codes for a particular compression algorithm applied to the compressed data.

At 2030, in one embodiment, a code length may be generated. The code length may be less than or equal to the maximum number of bits representing codes for a particular compression algorithm applied to the compressed data. In another embodiment, the code length may be a counter. In one embodiment, the counter may start at a minimum value for the number of bits representing codes for a particular compression algorithm applied to the compressed data. The counter may increment to a maximum value for the number of bits representing codes for a particular compression algorithm applied to the compressed data. In another embodiment, the counter may start at a maximum value for the number of bits representing codes for a particular compression algorithm applied to the compressed data. The counter may decrement to a minimum value for the number of bits representing codes for a particular compression algorithm applied to the compressed data. A segment of the payload may be obtained using the generated code length. In one embodiment, the segment may represent at least some of the most significant bits of the payload. In another embodiment, the segments may represent at least some of the least significant bits of the payload.

At 2035, a last code difference and a code length counter difference may be computed using a code information array as determined by the current mode. In one embodiment, the computation may occur within the compressed data decoder. In another embodiment, the computation may occur within a processor. The last code difference may represent the segment subtracted from a last code selected by the generated code length. The code length counter difference may represent the last code difference subtracted from a number representing the number of occurrences of a particular code length.

At 2040, the last code difference and code length difference may be evaluated. In one embodiment, the last code difference may be evaluated to determine if it is not less than zero and the code length counter difference may be evaluated to determine if it is not less than one. In another embodiment, the last code difference may be evaluated to determine if it is equal to or greater than zero and the code length counter difference may be evaluated to determine if it is equal to or greater than one. It may be determined whether to proceed. If so, method 2000 may proceed to 2045. Else, method 2000 may return to 2030.

At 2045, a mode for decoding the next payload may be determined based on the type of code matched. The type of code matched may need to be further decoded for code types that support multiple data formats. In one embodiment, the type of code matched may indicate that the next payload should be decoded for the same type of code. In another embodiment, the type of code matched may indicate that the next payload should be decoded for a different type of code.

At 2050, a code length and a code index may be determined. In one embodiment, the code index may represent the segment. In another embodiment, the code index may represent a computed value.

At 2055, a code may be determined from a code length and/or a code index. In one embodiment, the code index may be used to locate a code in a sorted table. In another embodiment, the code may be searched for in an unsorted table.

At 2060, a code may be translated into a value. In one embodiment, the translation may generate a length value. In another embodiment, the translation may generate a distance value. In a further embodiment, the translation may generate a literal value. In still yet another embodiment, the translation may yield the end of a block.

At 2065, a code type may optionally be evaluated to determine if the end of a block of compressed data has been reached. It may be determined whether to retire. If so, method 2000 may proceed to 2075. Else, method 2000 may proceed to 2070.

At 2070, a value may be decoded. In one embodiment, the value may be decoded within the compressed data decoder. In another embodiment, the value may be decoded within a processor. In a further embodiment, the value may be decoded in separate matching logic units chosen by the type of code encountered. In one embodiment, the method 2000 may terminate. In another embodiment, the decoded value may advance the payload by a computed number of bits consumed and proceed to 2025. The computed number of bits consumed may be calculated by the sum of the code length and the number of extra bits required.

At 2075, the instruction or instructions for compressed data may be retired.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system may include any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine-readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Accordingly, embodiments of the disclosure may also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part-on and part-off processor.

Thus, techniques for performing one or more instructions according to at least one embodiment are disclosed. While certain exemplary embodiments have been described and shown in the accompanying drawings, it is to be understood that such embodiments are merely illustrative of and not restrictive on other embodiments, and that such embodiments not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

In some embodiments of the present disclosure, a processor may include a front end to decode at least one instruction, an execution unit, an allocator or other mechanism to assign the instruction to the execution unit to execute the instruction. The instruction may be to decode compressed data. In combination with any of the above embodiments, in an embodiment the execution unit may include a code information array. In combination with any of the above embodiments, in an embodiment the code information array may include at least one pre-computed code length counter and at least one pre-computed last code. The pre-computed code length counter may include logic to count a number of occurrences for at least one particular code length and the pre-computed last code may include a last possible code for the particular code length. In combination with any of the above embodiments, in an embodiment the execution unit may include a matching logic unit including logic using the code information array to match a segment of a payload of the compressed data with a matching code length and a matching code index. In combination with any of the above embodiments, in an embodiment the execution unit may include a code value generator including logic to translate the matching code index into a code value. In combination with any of the above embodiments, in an embodiment the execution unit may include a decoder including logic to generate decompressed data from the code value and the matching code length.

In combination with any of the above embodiments, in an embodiment the matching logic unit may include logic to match at least one type of code. In combination with any of the above embodiments, in an embodiment the execution unit may include a second matching logic unit including logic to match a different type of code than the first matching logic unit. In combination with any of the above embodiments, in an embodiment the matching logic unit may include a code length generator. In combination with any of the above embodiments, in an embodiment the code length generator may include a floor register and logic to skip unused code lengths shorter than a shortest used code length. In combination with any of the above embodiments, in an embodiment the code length generator may include a ceiling register and logic to skip unused code lengths longer than a longest used code length. In combination with any of the above embodiments, in an embodiment the code value generator may include logic to generate a sorted table in order of increasing code length to translate the matching code index into the code value. In combination with any of the above embodiments, in an embodiment the matching logic unit may include logic to match a first range of code lengths. In combination with any of the above embodiments, in an embodiment the execution unit may include a second matching logic unit including logic to match a second range of code lengths. In combination with any of the above embodiments, the code information array may include at least one pre-computed cumulative code length counter. In combination with any of the above embodiments, the pre-computed cumulative code length counter may include logic to count a number of cumulative occurrences for a code length equal to or less than in length to the particular code length. In combination with any of the above embodiments, in an embodiment the matching logic unit may include logic to converge on the matching code length using a plurality of code length generators wherein at least one code length generator increases in value and at least one code length generator decreases in value.

In some of the present embodiments, a method may include, processing a header of compressed data. In combination with any of the above embodiments, in an embodiment the method may include computing at least one code length counter from a header of compressed data. In combination with any of the above embodiments, in an embodiment the method may include counting, with the code length counter, a number of occurrences of at least one particular code length. In combination with any of the above embodiments, in an embodiment the method may include computing at least one last code from the header, the last code including a last possible code for the particular code length. In combination with any of the above embodiments, in an embodiment the method may include matching, with at least one matching logic unit, a segment of a payload of the compressed data with a matching code length and a matching code index using the code length counter and the last code. In combination with any of the above embodiments, in an embodiment the method may include translating the matching code index into a code value. In combination with any of the above embodiments, in an embodiment the method may include decoding at least the segment using the code value and the matching code length.

In combination with any of the above embodiments, in an embodiment the method may include skipping unused code lengths shorter than a shortest used code length. In combination with any of the above embodiments, in an embodiment the method may include skipping unused code lengths longer than a longest used code length in the compressed data. In combination with any of the above embodiments, in an embodiment the method may include converging on the matching code length using a plurality of code length generators. In combination with any of the above embodiments, in an embodiment the method may include increasing the value of at least one code length generator and decreasing the value of at least one code length generator. In combination with any of the above embodiments, in an embodiment the method may include sorting a table in order of increasing code length to be used in translating the matching code index into the code value. In combination with any of the above embodiments, in an embodiment the method may include computing at least one cumulative code length counter. In combination with any of the above embodiments, in an embodiment the method may include the cumulative code length counter counting a number of cumulative occurrences for a code length equal to or less than in length to the particular code length. In combination with any of the above embodiments, in an embodiment the method may include matching a first range of code lengths with the matching logic unit and matching a second range of code lengths with a second matching logic unit.

In some embodiments of the present disclosure, a system may include a front end to decode at least one instruction, an execution unit, an allocator or other mechanism to assign the instruction to the execution unit to execute the instruction. The instruction may be to decode compressed data. In combination with any of the above embodiments, in an embodiment the execution unit may include a code information array. In combination with any of the above embodiments, in an embodiment the code information array may include at least one pre-computed code length counter and at least one pre-computed last code. The pre-computed code length counter may include logic to count a number of occurrences for at least one particular code length and the pre-computed last code may include a last possible code for the particular code length. In combination with any of the above embodiments, in an embodiment the execution unit may include a matching logic unit including logic using the code information array to match a segment of a payload of the compressed data with a matching code length and a matching code index. In combination with any of the above embodiments, in an embodiment the execution unit may include a code value generator including logic to translate the matching code index into a code value. In combination with any of the above embodiments, in an embodiment the execution unit may include a decoder including logic to generate decompressed data from the code value and the matching code length.

In combination with any of the above embodiments, in an embodiment the matching logic unit may include logic to match at least one type of code. In combination with any of the above embodiments, in an embodiment the execution unit may include a second matching logic unit including logic to match a different type of code than the first matching logic unit. In combination with any of the above embodiments, in an embodiment the matching logic unit may include a code length generator. In combination with any of the above embodiments, in an embodiment the code length generator may include a floor register and logic to skip unused code lengths shorter than a shortest used code length. In combination with any of the above embodiments, in an embodiment the code length generator may include a ceiling register and logic to skip unused code lengths longer than a longest used code length. In combination with any of the above embodiments, in an embodiment the code value generator may include logic to generate a sorted table in order of increasing code length to translate the matching code index into the code value. In combination with any of the above embodiments, in an embodiment the matching logic unit may include logic to match a first range of code lengths. In combination with any of the above embodiments, in an embodiment the execution unit may include a second matching logic unit including logic to match a second range of code lengths. In combination with any of the above embodiments, the code information array may include at least one pre-computed cumulative code length counter. In combination with any of the above embodiments, the pre-computed cumulative code length counter may include logic to count a number of cumulative occurrences for a code length equal to or less than in length to the particular code length. In combination with any of the above embodiments, in an embodiment the matching logic unit may include logic to converge on the matching code length using a plurality of code length generators wherein at least one code length generator increases in value and at least one code length generator decreases in value.

In some embodiments of the present disclosure, a compressed data decoder may include a code information array. In combination with any of the above embodiments, in an embodiment the code information array may include at least one pre-computed code length counter and at least one pre-computed last code. The pre-computed code length counter may include logic to count a number of occurrences for at least one particular code length and the pre-computed last code may include a last possible code for the particular code length. In combination with any of the above embodiments, in an embodiment the compressed data decoder may include a matching logic unit including logic using the code information array to match a segment of a payload of the compressed data with a matching code length and a matching code index. In combination with any of the above embodiments, in an embodiment the compressed data decoder may include a code value generator including logic to translate the matching code index into a code value. In combination with any of the above embodiments, in an embodiment the compressed data decoder may include a decoder including logic to generate decompressed data from the code value and the matching code length.

In combination with any of the above embodiments, in an embodiment the matching logic unit may include logic to match at least one type of code. In combination with any of the above embodiments, in an embodiment the compressed data decoder may include a second matching logic unit including logic to match a different type of code than the first matching logic unit. In combination with any of the above embodiments, in an embodiment the matching logic unit may include a code length generator. In combination with any of the above embodiments, in an embodiment the code length generator may include a floor register and logic to skip unused code lengths shorter than a shortest used code length. In combination with any of the above embodiments, in an embodiment the code length generator may include a ceiling register and logic to skip unused code lengths longer than a longest used code length. In combination with any of the above embodiments, in an embodiment the code value generator may include logic to generate a sorted table in order of increasing code length to translate the matching code index into the code value. In combination with any of the above embodiments, in an embodiment the matching logic unit may include logic to match a first range of code lengths. In combination with any of the above embodiments, in an embodiment the compressed data decoder may include a second matching logic unit including logic to match a second range of code lengths. In combination with any of the above embodiments, the code information array may include at least one pre-computed cumulative code length counter. In combination with any of the above embodiments, the pre-computed cumulative code length counter may include logic to count a number of cumulative occurrences for a code length equal to or less than in length to the particular code length. In combination with any of the above embodiments, in an embodiment the matching logic unit may include logic to converge on the matching code length using a plurality of code length generators wherein at least one code length generator increases in value and at least one code length generator decreases in value.

In some embodiments of the present disclosure, an apparatus may include a means for storing code information. In combination with any of the above embodiments, in an embodiment the means for storing code information may include at least one pre-computed code length counter and at least one pre-computed last code. The pre-computed code length counter may include a means to count a number of occurrences for at least one particular code length and the pre-computed last code may include a last possible code for the particular code length. In combination with any of the above embodiments, in an embodiment the apparatus may include a matching means including logic using the means for storing code information to match a segment of a payload of the compressed data with a matching code length and a matching code index. In combination with any of the above embodiments, in an embodiment the apparatus may include code value generation means including logic to translate the matching code index into a code value. In combination with any of the above embodiments, in an embodiment the apparatus may include a decoding means including logic to generate decompressed data from the code value and the matching code length.

In combination with any of the above embodiments, in an embodiment the matching means may include logic to match at least one type of code. In combination with any of the above embodiments, in an embodiment the apparatus may include a second matching means including logic to match a different type of code than the first matching means. In combination with any of the above embodiments, in an embodiment the matching means may include a code length generation means. In combination with any of the above embodiments, in an embodiment the code length generation means may include a floor register and logic to skip unused code lengths shorter than a shortest used code length. In combination with any of the above embodiments, in an embodiment the code length generation means may include a ceiling register and logic to skip unused code lengths longer than a longest used code length. In combination with any of the above embodiments, in an embodiment the code value generation means may include logic to generate a sorted table in order of increasing code length to translate the matching code index into the code value. In combination with any of the above embodiments, in an embodiment the matching means may include logic to match a first range of code lengths. In combination with any of the above embodiments, in an embodiment the apparatus may include a second matching means including logic to match a second range of code lengths. In combination with any of the above embodiments, the means for storing code information may include at least one pre-computed cumulative code length counter. In combination with any of the above embodiments, the pre-computed cumulative code length counter may include a means to count a number of cumulative occurrences for a code length equal to or less than in length to the particular code length. In combination with any of the above embodiments, in an embodiment the matching means may include a converging means to match the matching code length using a plurality of code length generation means wherein at least one code length generation means increases in value and at least one code length generation means decreases in value.

What is claimed is:

1. A processor, comprising:
   a front end to decode an instruction, the instruction to decode compressed data;
   an execution unit;
   an allocator to assign the instruction to the execution unit to execute the instruction;
   wherein the execution unit includes:
      a code information array, the code information array to include:
         a pre-computed code length counter including circuitry to count a number of occurrences for a particular code length, and
         a pre-computed last code to include a last possible code for the particular code length;
      a matching logic unit including circuitry to use the code information array to match a segment of a payload of the compressed data with a matching code length and a matching code index;
      a code value generator including circuitry to translate the matching code index into a code value; and
      a decoder including circuitry to generate decompressed data from the code value and the matching code length.

2. The processor of claim 1, wherein:
   the matching logic unit further includes circuitry to match a type of code; and
   the execution unit further includes a second matching logic unit including circuitry to match a different type of code than the first matching logic unit.

3. The processor of claim 1, wherein the matching logic unit includes a code length generator with a floor register and circuitry to skip unused code lengths shorter than a shortest used code length.

4. The processor of claim 1, wherein the matching logic unit includes a code length generator with a ceiling register and circuitry to skip unused code lengths longer than a longest used code length.

5. The processor of claim 1, wherein the code value generator includes circuitry to generate a sorted table in order of increasing code length to translate the matching code index into the code value.

6. The processor of claim 1, wherein:
   the matching logic unit includes circuitry to match a first range of code lengths; and
   the execution unit further includes a second matching logic unit including circuitry to match a second range of code lengths.

7. The processor of claim 1, wherein the code information array further includes a pre-computed cumulative code length counter, the pre-computed cumulative code length counter including circuitry to count a number of cumulative occurrences for a code length equal to or less than in length to the particular code length.

8. A method for accelerated compressed data decoding, comprising, within a hardware processor:

computing a code length counter from a header of compressed data, the code length counter counting a number of occurrences of a particular code length;

computing a last code from the header, the last code including a last possible code of the particular code length;

matching, with a matching logic unit included in the processor, a segment of a payload of the compressed data with a matching code length and a matching code index using the code length counter and the last code;

translating the matching code index into a code value; and decoding at least the segment using the code value and the matching code length.

9. The method of claim 8, wherein the step of matching the segment with the matching code length further comprises skipping unused code lengths shorter than a shortest used code length in the compressed data.

10. The method of claim 8, wherein the step of matching the segment with the matching code length further comprises skipping unused code lengths longer than a longest used code length in the compressed data.

11. The method of claim 8, wherein the step of matching the segment with the matching code length further comprises converging on the matching code length using a plurality of code length generators wherein a code length generator increases in value and a code length generator decreases in value.

12. The method of claim 8, further comprising sorting a table in order of increasing code length to be used in translating the matching code index into the code value.

13. The method of claim 8, further comprising computing a cumulative code length counter, the cumulative code length counter counting a number of cumulative occurrences for a code length equal to or less than in length to the particular code length.

14. A compressed data decoder, comprising:
a code information array, the code information array including:
 a pre-computed code length counter, the pre-computed code length counter including circuitry to count a number of occurrences for a particular code length, and
 a pre-computed last code, the pre-computed last code including a last possible code for the particular code length;
a matching logic unit including circuitry using the code information array to match a segment of a payload of compressed data with a matching code length and a matching code index;
a code value generator including circuitry to translate the matching code index into a code value; and
a decoder including circuitry to generate decompressed data from the code value and the matching code length.

15. The compressed data decoder of claim 14, wherein:
the matching logic unit includes circuitry to match a type of code; and
the compressed data decoder further includes a second matching logic unit including circuitry to match a different type of code than the first matching logic unit.

16. The compressed data decoder of claim 14, wherein the matching logic unit includes a code length generator with a floor register and circuitry to skip unused code lengths shorter than a shortest used code length.

17. The compressed data decoder of claim 14, wherein the matching logic unit includes a code length generator with a ceiling register and circuitry to skip unused code lengths longer than a longest used code length.

18. The compressed data decoder of claim 14, wherein the code value generator includes circuitry to generate a sorted table in order of increasing code length to translate the matching code index into the code value.

19. The compressed data decoder of claim 14, wherein the matching logic unit includes circuitry to match a first range of code lengths and the compressed data decoder further includes a second matching logic unit including logic to match a second range of code lengths.

20. The compressed data decoder of claim 14, wherein the code information array further includes a pre-computed cumulative code length counter, the pre-computed cumulative code length counter including circuitry to count a number of cumulative occurrences for a code length equal to or less than in length to the particular code length.

* * * * *